(12) United States Patent
Momchilov

(10) Patent No.: US 10,824,450 B2
(45) Date of Patent: Nov. 3, 2020

(54) SYSTEMS AND METHODS FOR REMOTE COMPUTING SESSIONS WITH VARIABLE FORWARD ERROR CORRECTION (FEC)

(71) Applicant: CITRIX SYSTEMS, INC., Fort Lauderdale, FL (US)

(72) Inventor: Georgy Momchilov, Parkland, FL (US)

(73) Assignee: CITRIX SYSTEMS, INC., Fort Lauderdale, FL (US)

( * ) Notice: Subject to any disclaimer, the term of this patent is extended or adjusted under 35 U.S.C. 154(b) by 0 days.

(21) Appl. No.: 16/403,071

(22) Filed: May 3, 2019

(65) Prior Publication Data

US 2019/0339998 A1     Nov. 7, 2019

Related U.S. Application Data

(60) Provisional application No. 62/667,072, filed on May 4, 2018.

(51) Int. Cl.
*G06F 9/451* (2018.01)
*H04L 1/00* (2006.01)
(Continued)

(52) U.S. Cl.
CPC ............ *G06F 9/452* (2018.02); *G06F 3/0488* (2013.01); *G06F 9/3877* (2013.01);
(Continued)

(58) Field of Classification Search
CPC .... G06F 9/452; G06F 3/0488; G06F 9/45558; G06F 9/3877; G06F 9/544; G06F 2009/45595; G06F 3/0484; G06F 2209/545; H04L 1/004; H04L 67/14; H04L 67/38; H04L 47/27; H04L 65/80; H04L 1/0057; H04L 47/624; H04L 67/08; H04L 67/42
See application file for complete search history.

(56) References Cited

U.S. PATENT DOCUMENTS

| | | |
|---|---|---|
| 6,081,623 A | 6/2000 | Bloomfield et al. |
| 7,584,294 B2 | 9/2009 | Plamondon |

(Continued)

OTHER PUBLICATIONS

U.S. Appl. No. 16/403,056, filed May 3, 2019 Georgy Momchilov.
(Continued)

*Primary Examiner* — Maurice L. McDowell, Jr.
(74) *Attorney, Agent, or Firm* — Allen, Dyer, Doppelt + Gilchrist, PA

(57) ABSTRACT

A server may include a memory and a processor cooperating with the memory to host virtual computing sessions to be remotely displayed at a client device via a frame buffer, where the client device is configured to render the virtual computing sessions via a graphical user interface (GUI). The processor may further generate forward error correction (FEC) data for graphical content within the frame buffer based upon a ratio of graphical content bandwidth to FEC bandwidth, and determine a Quality of Service (QoS) parameter associated with the at least one virtual channel. The processor may further adjust the ratio of graphical content bandwidth to FEC bandwidth based upon changes in the QoS parameter, and send the graphical content and associated FEC data to the client device over at least one virtual channel for display within the GUI.

20 Claims, 14 Drawing Sheets

(51) Int. Cl.
*H04L 12/863* (2013.01)
*H04L 29/08* (2006.01)
*H04L 29/06* (2006.01)
*G06F 9/38* (2018.01)
*G06F 9/54* (2006.01)
*H04L 12/807* (2013.01)
*G06F 3/0488* (2013.01)
*G06F 9/455* (2018.01)
*G06F 3/0484* (2013.01)

(52) U.S. Cl.
CPC .......... *G06F 9/45558* (2013.01); *G06F 9/544* (2013.01); *H04L 1/004* (2013.01); *H04L 1/0057* (2013.01); *H04L 47/27* (2013.01); *H04L 47/624* (2013.01); *H04L 65/80* (2013.01); *H04L 67/08* (2013.01); *H04L 67/14* (2013.01); *H04L 67/38* (2013.01); *H04L 67/42* (2013.01); *G06F 3/0484* (2013.01); *G06F 2009/45595* (2013.01)

(56) References Cited

U.S. PATENT DOCUMENTS

| | | |
|---|---|---|
| 7,809,818 B2 | 10/2010 | Plamondon |
| 8,355,407 B2 | 1/2013 | Wookey et al. |
| 8,364,785 B2 | 1/2013 | Plamondon |
| 8,504,775 B2 | 8/2013 | Plamondon |
| 8,615,583 B2 | 12/2013 | Plamondon |
| 8,701,010 B2 | 4/2014 | Plamondon |
| 8,713,474 B2 | 4/2014 | Desai et al. |
| 8,856,783 B2 | 10/2014 | Sharp et al. |
| 8,935,316 B2 | 1/2015 | Ryman |
| 9,191,425 B2 | 11/2015 | Momchilov et al. |
| 9,276,864 B1* | 3/2016 | Vincent .................. H04L 47/25 |
| 9,436,361 B2 | 9/2016 | Mir et al. |
| 9,588,637 B2 | 3/2017 | Momchilov et al. |
| 9,736,221 B2 | 8/2017 | Momchilov et al. |
| 2007/0192812 A1* | 8/2007 | Pickens .............. H04N 21/4384 725/94 |
| 2014/0052864 A1 | 2/2014 | Van Der Linden et al. |
| 2015/0150007 A1* | 5/2015 | Belkine ................ G06F 11/301 718/1 |
| 2017/0238022 A1* | 8/2017 | Kottana .............. H04N 19/895 375/240.27 |

OTHER PUBLICATIONS

U.S. Appl. No. 16/403,102, filed May 3, 2019 Georgy Momchilov.
Anonymous "Thinwire" https://docs.citrix.com/en-us/citrix-virtual-apps-desktops/graphics/thinwire.html: Aug. 29, 2018; pp. 6.
Beth Pollack "Thinwire progressive display" https://docs.citrix.com/en-us/linux-virtual-delivery-agent/current-release/configuration/thinwire-progressive-display.html; Dec. 3, 2018; 3 pgs.

* cited by examiner

SYSTEMS AND METHODS FOR REMOTE COMPUTING SESSIONS WITH VARIABLE FORWARD ERROR CORRECTION (FEC)

CROSS-REFERENCE TO RELATED APPLICATIONS

This application claims the benefit of U.S. provisional app. No. 62/667,072 filed May 4, 2018, which is hereby incorporated herein in its entirety by reference.

BACKGROUND

Traditionally, personal computers include combinations of operating systems, applications, and user settings, which are each managed individually by owners or administrators on an ongoing basis. However, many organizations are now using application and/or desktop virtualization to provide a more flexible option to address the varying needs of their users. In desktop virtualization, a user's computing environment (e.g., operating system, applications, and/or user settings) may be separated from the user's physical computing device (e.g., smartphone, laptop, desktop computer). Using client-server technology, a "virtualized desktop" may be stored in and administered by a remote server, rather than in the local storage of the client computing device.

There are several different types of desktop virtualization systems. As an example, Virtual Desktop Infrastructure (VDI) refers to the process of running a user desktop inside a virtual machine that resides on a server. VDI and other server-based desktop virtualization systems may provide personalized desktops for each user, while allowing for centralized management and security. Servers in such systems may include storage for virtual desktop images and system configuration information, as well as software components to provide the virtual desktops and allow users to interconnect to them. For example, a VDI server(s) may include one or more hypervisors (virtual machine managers) to create and maintain multiple virtual machines, software to manage the hypervisor(s), a connection broker, and software to provision and manage the virtual desktops. In some embodiments, a VDI server(s) may provide access to shared server-based hosted applications, as well as Web/Software-as-a-Service (SaaS) applications.

Desktop virtualization systems may be implemented using a single virtualization server or a combination of servers interconnected as a server grid. For example, a cloud computing environment, or cloud system, may include a pool of computing resources (e.g., desktop virtualization servers), storage disks, networking hardware, and other physical resources that may be used to provision virtual desktops, and/or provide access to shared applications, along with additional computing devices to provide management and customer portals for the cloud system. In some implementations, Desktop as a Service (DaaS) sessions may be run from a cloud computing environment for different tenants or enterprises.

SUMMARY

A server may include a memory and a processor cooperating with the memory to host virtual computing sessions to be remotely displayed at a client device via a frame buffer, where the client device is configured to render the virtual computing sessions via a graphical user interface (GUI). The processor may further generate forward error correction (FEC) data for graphical content within the frame buffer based upon a ratio of graphical content bandwidth to FEC bandwidth, and determine a Quality of Service (QoS) parameter associated with at least one virtual channel. The processor may further adjust the ratio of graphical content bandwidth to FEC bandwidth based upon changes in the QoS parameter, and send the graphical content and associated FEC data to the client device over the at least one virtual channel for display within the GUI.

In one example implementation, the graphical content sent to the client device may be divided into packets, with the QoS parameter comprising a packet loss rate, and the ratio of graphical content bandwidth to FEC bandwidth may decrease as the packet loss rate increases. Furthermore, the processor may selectively change the ratio of graphical content bandwidth to FEC bandwidth without changing an overall bandwidth of the at least one virtual channel in some embodiments. In accordance with another example embodiment, the at least one virtual channel may comprise a reliable channel and a lossy channel, and a ratio of graphical content bandwidth to FEC bandwidth on the reliable channel may be higher than a ratio of graphical content bandwidth to FEC bandwidth on the lossy channel.

In another example implementation, the QoS parameter may comprise latency, and the ratio of graphical content bandwidth to FEC bandwidth may decrease as latency increases. In still another example, the QoS parameter may comprise an estimated bandwidth for the at least one graphics channel. Additionally, the QoS parameter may comprise an expected bitrate associated with the at least one virtual channel in other example embodiments, and the ratio of graphical content bandwidth to FEC bandwidth may decrease as the expected bitrate decreases, for example.

In still another example, the QoS parameter may comprise a server load associated with the server. Furthermore, in an example implementation the processor may also be configured to selectively change the ratio of graphical content bandwidth to FEC bandwidth based upon a priority of the graphical content data within the frame buffer. In still another example implementation, the processor may be further configured to selectively change the ratio of graphical content bandwidth to FEC bandwidth based upon a size of the graphical content data within the frame buffer.

A related method may include hosting virtual computing sessions at a server to be remotely displayed at a client device via a frame buffer, where the client device is configured to render the virtual computing sessions via a GUI. The method may further include generating FEC data for graphical content within the frame buffer at the server based upon a ratio of graphical content bandwidth to FEC bandwidth, and sending the graphical content and associated FEC data from the server to the client device over at least one virtual channel for display within the GUI. The method may also include determining a QoS parameter associated with the at least one virtual channel, and selectively changing the ratio of graphical content bandwidth to FEC bandwidth at the server based upon changes in the QoS parameter.

A related computing system may include a server configured to host virtual computing sessions to be remotely displayed via a frame buffer, and a client device configured to remotely access the virtual computing sessions from the server and render the virtual computing session via a GUI. The server may be further configured to generate FEC data for graphical content within the frame buffer based upon a ratio of graphical content bandwidth to FEC bandwidth, and send the graphical content and associated FEC data to the client device over at least one virtual channel for display within the GUI. The server may be further configured to determine a QoS parameter associated with the at least one virtual channel, and selectively change the ratio of graphical content bandwidth to FEC bandwidth based upon changes in the QoS parameter.

DETAILED DESCRIPTION

Generally speaking, the embodiments disclosed herein relate to computing systems providing remote access to virtual computing sessions. More particularly, as more workloads are migrated into the Cloud and datacenters are consolidated across continents, the network conditions between the workloads and the client endpoints become more challenging and are characterized with much higher latency and packet loss, making it difficult to remotely display virtual computing sessions at client devices. Moreover, high-resolution, e.g. 4K, and multi-monitor displays make graphics loads even higher. Conversely, while using mobile devices, while resolutions are lower, there is expectation of native-like application responsiveness with Citrix Receiver/Workspace App.

Current user experience with respect to remotely displayed virtual computing sessions may accordingly become "laggy" in certain instances. For examples, such instances may include: normal office workloads such as typing, mouse or touch window dragging, scrolling, app switching, etc.; 3D Pro use cases of interacting with complex 3D graphics models; and Virtual Reality (VR) use cases with XenApp hosted apps.

The embodiments set forth herein advantageously provide for enhanced delivery and rendering of graphics from virtual sessions hosted by a virtualization server, which in some implementations may be hosted in a cloud computing environment. This results in an improved quality and/or speed at which user input may be delivered to virtual computing sessions and/or graphics updates may be rendered in a graphical user interface (GUI) by client computing devices, for example, with reduced or negligible impact to bandwidth and/or system load.

The present description is made with reference to the accompanying drawings, in which example embodiments are shown. However, many different embodiments may be used, and thus the description should not be construed as limited to the particular embodiments set forth herein. Like numbers refer to like elements throughout.

As will be appreciated by one of skill in the art upon reading the following disclosure, various aspects described herein may be embodied as a device, a method or a computer program product (e.g., a non-transitory computer-readable medium having computer executable instruction for performing the noted operations or steps). Accordingly, those aspects may take the form of an entirely hardware embodiment, an entirely software embodiment, or an embodiment combining software and hardware aspects.

Furthermore, such aspects may take the form of a computer program product stored by one or more computer-readable storage media having computer-readable program code, or instructions, embodied in or on the storage media. Any suitable computer readable storage media may be utilized, including hard disks, CD-ROMs, optical storage devices, magnetic storage devices, and/or any combination thereof.

Figure 1:
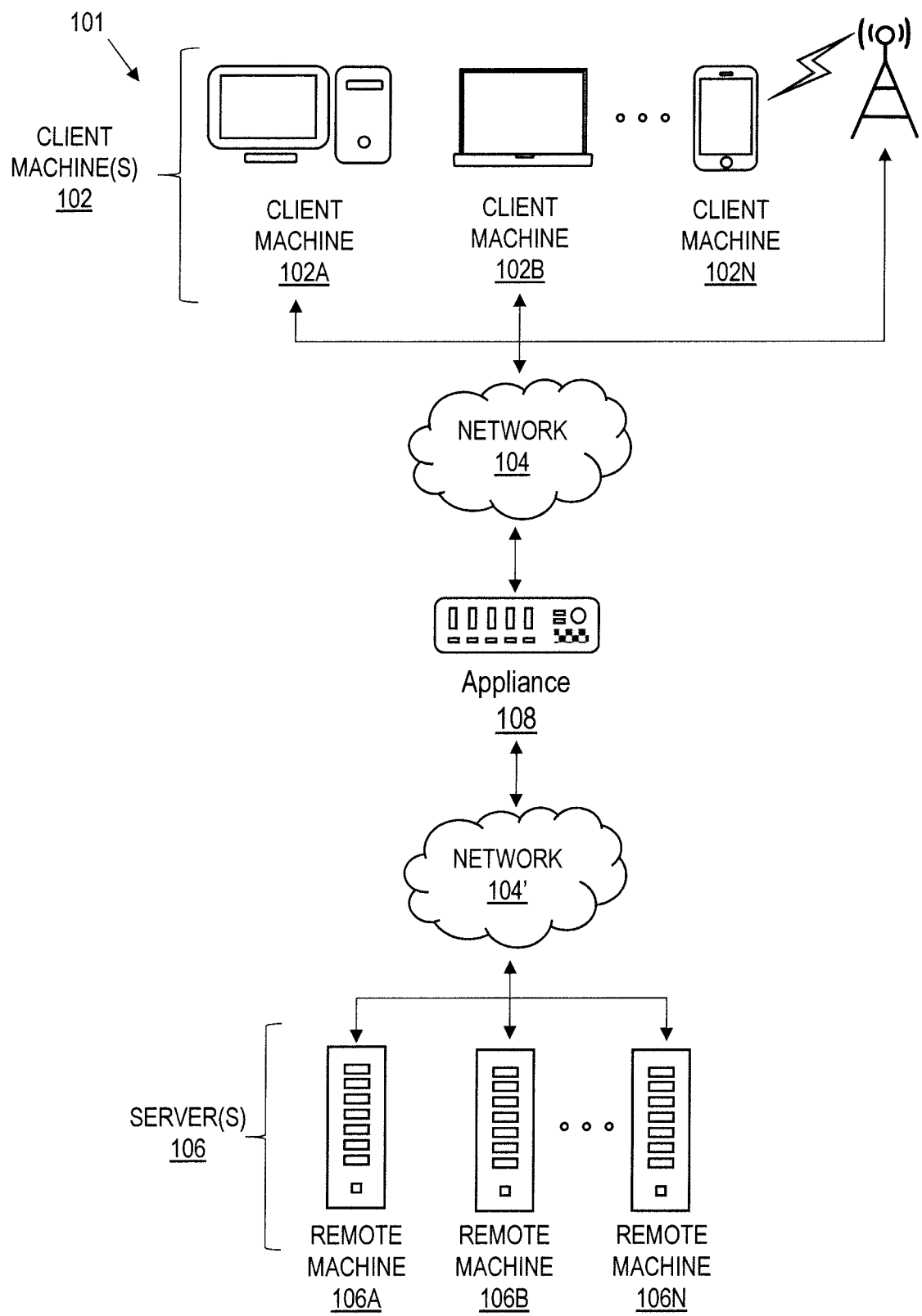
FIG. 1 is a block diagram of a network environment of computing devices in which various aspects of the disclosure may be implemented.

Referring initially to FIG. 1, a non-limiting network environment 101 in which various aspects of the disclosure may be implemented includes one or more client machines 102A-102N, one or more remote machines 106A-106N, one or more networks 104, 104', and one or more appliances 108 installed within the computing environment 101. The client machines 102A-102N communicate with the remote machines 106A-106N via the networks 104, 104'.

In some embodiments, the client machines 102A-102N communicate with the remote machines 106A-106N via an intermediary appliance 108. The illustrated appliance 108 is positioned between the networks 104, 104' and may also be referred to as a network interface or gateway. In some embodiments, the appliance 108 may operate as an application delivery controller (ADC) to provide clients with access to business applications and other data deployed in a datacenter, the cloud, or delivered as Software as a Service (SaaS) across a range of client devices, and/or provide other functionality such as load balancing, etc. In some embodiments, multiple appliances 108 may be used, and the appliance(s) 108 may be deployed as part of the network 104 and/or 104'.

The client machines 102A-102N may be generally referred to as client machines 102, local machines 102, clients 102, client nodes 102, client computers 102, client devices 102, computing devices 102, endpoints 102, or endpoint nodes 102. The remote machines 106A-106N may be generally referred to as servers 106 or a server farm 106. In some embodiments, a client device 102 may have the capacity to function as both a client node seeking access to resources provided by a server 106 and as a server 106 providing access to hosted resources for other client devices 102A-102N. The networks 104, 104' may be generally referred to as a network 104. The networks 104 may be configured in any combination of wired and wireless networks.

A server 106 may be any server type such as, for example: a file server; an application server; a web server; a proxy server; an appliance; a network appliance; a gateway; an application gateway; a gateway server; a virtualization server; a deployment server; a Secure Sockets Layer Virtual Private Network (SSL VPN) server; a firewall; a web server; a server executing an active directory; a cloud server; or a server executing an application acceleration program that provides firewall functionality, application functionality, or load balancing functionality.

A server 106 may execute, operate or otherwise provide an application that may be any one of the following: software; a program; executable instructions; a virtual machine; a hypervisor; a web browser; a web-based client; a client-server application; a thin-client computing client; an ActiveX control; a Java applet; software related to voice over internet protocol (VoIP) communications like a soft IP telephone; an application for streaming video and/or audio; an application for facilitating real-time-data communications; a HTTP client; a FTP client; an Oscar client; a Telnet client; or any other set of executable instructions.

In some embodiments, a server 106 may execute a remote presentation services program or other program that uses a thin-client or a remote-display protocol to capture display output generated by an application executing on a server 106 and transmit the application display output to a client device 102.

In yet other embodiments, a server 106 may execute a virtual machine providing, to a user of a client device 102, access to a computing environment. The client device 102 may be a virtual machine. The virtual machine may be managed by, for example, a hypervisor, a virtual machine manager (VMM), or any other hardware virtualization technique within the server 106.

In some embodiments, the network 104 may be: a local-area network (LAN); a metropolitan area network (MAN); a wide area network (WAN); software-defined networking in a wide area network (SD-WAN); a primary public network 104; and a primary private network 104. Additional embodiments may include a network 104 of mobile telephone networks that use various protocols to communicate among mobile devices. For short range communications within a wireless local-area network (WLAN), the protocols may include 802.11, Bluetooth, and Near Field Communication (NFC).

One particularly advantageous implementation of SD-WAN enterprises is provided by Citrix SD-WAN, which allows enterprises to render their WANs with more scalability, and in a cost-effective that is ready to connect to the cloud. Citrix SD-WAN contains an integrated database and deep packet inspection to identify applications, including individual SaaS applications, and intelligently steer traffic from the branch to the Internet, cloud, or SaaS. Moreover, Citrix SD-WAN also provides the ability to route traffic from the branch to the Internet via a secure web gateway, delivering cloud-based security including firewall, URL filtering, and usage accounting.

Figure 2:
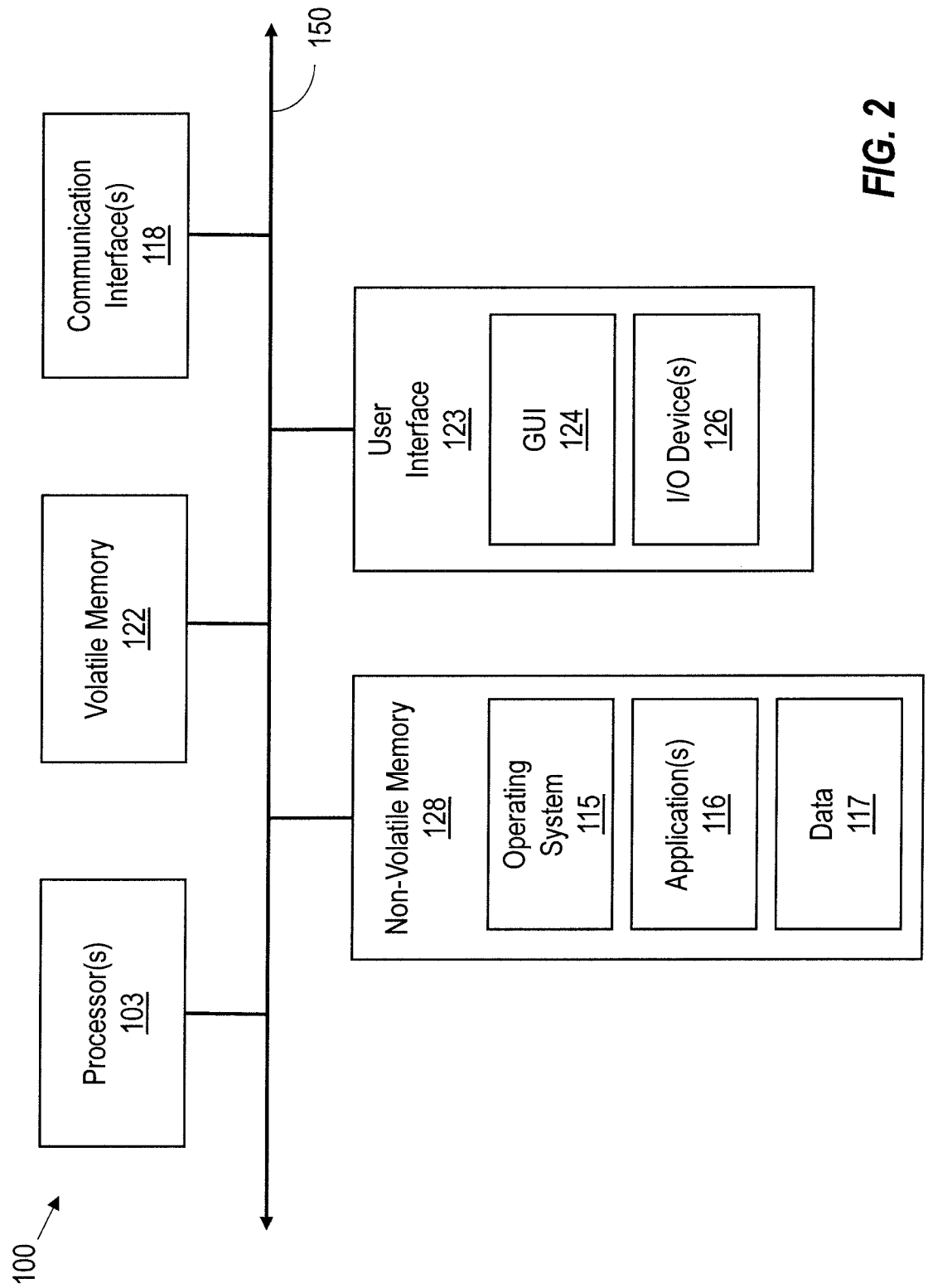
FIG. 2 is a block diagram of a computing device useful for practicing an embodiment of the client machines or the remote machines illustrated in FIG. 1.

FIG. 2 depicts a block diagram of a computing device 100 useful for practicing an embodiment of client devices 102, appliances 108 and/or servers 106. The computing device 100 includes one or more processors 103, volatile memory 122 (e.g., random access memory (RAM)), non-volatile memory 128, user interface (UI) 123, one or more communications interfaces 118, and a communications bus 150.

The non-volatile memory 128 may include: one or more hard disk drives (HDDs) or other magnetic or optical storage media; one or more solid state drives (SSDs), such as a flash drive or other solid-state storage media; one or more hybrid magnetic and solid-state drives; and/or one or more virtual storage volumes, such as a cloud storage, or a combination of such physical storage volumes and virtual storage volumes or arrays thereof.

The user interface 123 may include a graphical user interface (GUI) 124 (e.g., a touchscreen, a display, etc.) and one or more input/output (I/O) devices 126 (e.g., a mouse, a keyboard, a microphone, one or more speakers, one or more cameras, one or more biometric scanners, one or more environmental sensors, and one or more accelerometers, etc.).

The non-volatile memory 128 stores an operating system 115, one or more applications 116, and data 117 such that, for example, computer instructions of the operating system 115 and/or the applications 116 are executed by processor(s) 103 out of the volatile memory 122. In some embodiments, the volatile memory 122 may include one or more types of RAM and/or a cache memory that may offer a faster response time than a main memory. Data may be entered using an input device of the GUI 124 or received from the I/O device(s) 126. Various elements of the computer 100 may communicate via the communications bus 150.

The illustrated computing device 100 is shown merely as an example client device or server, and may be implemented by any computing or processing environment with any type of machine or set of machines that may have suitable hardware and/or software capable of operating as described herein.

The processor(s) 103 may be implemented by one or more programmable processors to execute one or more executable instructions, such as a computer program, to perform the functions of the system. As used herein, the term "processor" describes circuitry that performs a function, an operation, or a sequence of operations. The function, operation, or sequence of operations may be hard coded into the circuitry or soft coded by way of instructions held in a memory device and executed by the circuitry. A processor may perform the function, operation, or sequence of operations using digital values and/or using analog signals.

In some embodiments, the processor can be embodied in one or more application specific integrated circuits (ASICs), microprocessors, digital signal processors (DSPs), graphics processing units (CPUs), microcontrollers, field programmable gate arrays (FPGAs), programmable logic arrays (PLAs), multi-core processors, or general-purpose computers with associated memory.

The processor 103 may be analog, digital or mixed-signal. In some embodiments, the processor 103 may be one or more physical processors, or one or more virtual (e.g., remotely located or cloud) processors. A processor including multiple processor cores and/or multiple processors may provide functionality for parallel, simultaneous execution of instructions or for parallel, simultaneous execution of one instruction on more than one piece of data.

The communications interfaces 118 may include one or more interfaces to enable the computing device 100 to access a computer network such as a LAN, a WAN or SD-WAN, a Personal Area Network (PAN), or the Internet through a variety of wired and/or wireless connections, including cellular connections.

In described embodiments, the computing device 100 may execute an application on behalf of a user of a client device. For example, the computing device 100 may execute one or more virtual machines managed by a hypervisor. Each virtual machine may provide an execution session within which applications execute on behalf of a user or a client device, such as a hosted desktop session. The computing device 100 may also execute a terminal services session to provide a hosted desktop environment. The computing device 100 may provide access to a remote computing environment including one or more applications, one or more desktop applications, and one or more desktop sessions in which one or more applications may execute.

An example virtualization server 106 may be implemented using Citrix Hypervisor provided by Citrix Systems, Inc., of Fort Lauderdale, Fla. ("Citrix Systems"). Virtual app and desktop sessions may further be provided by Citrix Virtual Apps and Desktops, also from Citrix Systems. Citrix Virtual Apps and Desktops is an application virtualization solution that enhances productivity with universal access to virtual sessions including virtual app, desktop, and data sessions from any device, plus the option to implement a scalable VDI solution.

Figure 3:
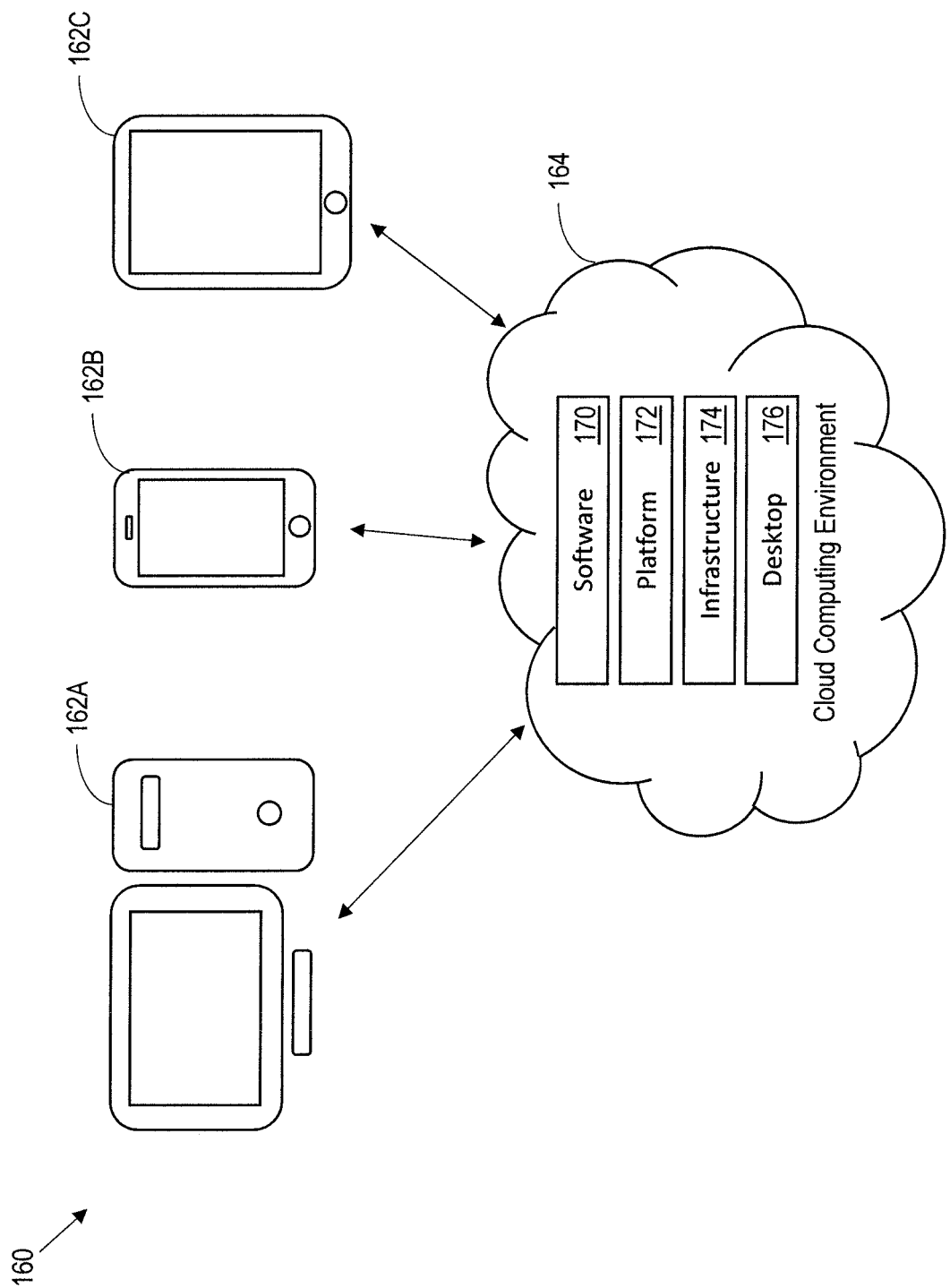
FIG. 3 is a schematic block diagram of a cloud computing environment in which various aspects of the disclosure may be implemented.

Referring to FIG. 3, a cloud computing environment 160 is depicted, which may also be referred to as a cloud environment, cloud computing or cloud network. The cloud computing environment 160 can provide the delivery of shared computing services and/or resources to multiple users or tenants. For example, the shared resources and services can include, but are not limited to, networks, network bandwidth, servers, processing, memory, storage, applications, virtual machines, databases, software, hardware, analytics, and intelligence.

In the cloud computing environment 160, one or more clients 162A-162C (such as those described above) are in communication with a cloud network 164. The cloud network 164 may include back-end platforms, e.g., servers, storage, server farms or data centers. The users or clients 162A-162C can correspond to a single organization/tenant or multiple organizations/tenants. More particularly, in one example implementation the cloud computing environment 160 may provide a private cloud serving a single organization (e.g., enterprise cloud). In another example, the cloud computing environment 160 may provide a community or public cloud serving multiple organizations/tenants.

In some embodiments, a gateway appliance(s) or service may be utilized to provide access to cloud computing resources and virtual sessions. By way of example, Citrix Gateway, provided by Citrix Systems, Inc., may be deployed on-premises or on public clouds to provide users with secure access and single sign-on to virtual, SaaS and web applications. Furthermore, to protect users from web threats, a gateway such as Citrix Secure Web Gateway may be used. Citrix Secure Web Gateway uses a cloud-based service and a local cache to check for URL reputation and category.

In still further embodiments, the cloud computing environment 160 may provide a hybrid cloud that is a combination of a public cloud and a private cloud. Public clouds may include public servers that are maintained by third parties to the clients 162A-162C or the enterprise/tenant. The servers may be located off-site in remote geographical locations or otherwise.

The cloud computing environment 160 can provide resource pooling to serve multiple users via clients 162A-162C through a multi-tenant environment or multi-tenant model with different physical and virtual resources dynamically assigned and reassigned responsive to different demands within the respective environment. The multi-tenant environment can include a system or architecture that can provide a single instance of software, an application or a software application to serve multiple users. In some embodiments, the cloud computing environment 160 can provide on-demand self-service to unilaterally provision computing capabilities (e.g., server time, network storage) across a network for multiple clients 162A-162C. By way of example, provisioning services may be provided through a system such as Citrix Provisioning Services (Citrix PVS). Citrix PVS is a software-streaming technology that delivers patches, updates, and other configuration information to multiple virtual desktop endpoints through a shared desktop image. The cloud computing environment 160 can provide an elasticity to dynamically scale out or scale in responsive to different demands from one or more clients 162. In some embodiments, the cloud computing environment 160 can include or provide monitoring services to monitor, control and/or generate reports corresponding to the provided shared services and resources.

In some embodiments, the cloud computing environment 160 may provide cloud-based delivery of different types of cloud computing services, such as Software as a service (SaaS) 170, Platform as a Service (PaaS) 172, Infrastructure as a Service (IaaS) 174, and Desktop as a Service (DaaS) 176, for example. IaaS may refer to a user renting the use of infrastructure resources that are needed during a specified time period. IaaS providers may offer storage, networking, servers or virtualization resources from large pools, allowing the users to quickly scale up by accessing more resources as needed. Examples of IaaS include AMAZON WEB SERVICES provided by Amazon.com, Inc., of Seattle, Wash., RACKSPACE CLOUD provided by Rackspace US, Inc., of San Antonio, Tex., Google Compute Engine provided by Google Inc. of Mountain View, Calif., or RIGHTSCALE provided by RightScale, Inc., of Santa Barbara, Calif.

PaaS providers may offer functionality provided by IaaS, including, e.g., storage, networking, servers or virtualization, as well as additional resources such as, e.g., the operating system, middleware, or runtime resources. Examples of PaaS include WINDOWS AZURE provided by Microsoft Corporation of Redmond, Wash., Google App Engine provided by Google Inc., and HEROKU provided by Heroku, Inc. of San Francisco, Calif.

SaaS providers may offer the resources that PaaS provides, including storage, networking, servers, virtualization, operating system, middleware, or runtime resources. In some embodiments, SaaS providers may offer additional resources including, e.g., data and application resources. Examples of SaaS include GOOGLE APPS provided by Google Inc., SALESFORCE provided by Salesforce.com Inc. of San Francisco, Calif., or OFFICE 365 provided by Microsoft Corporation. Examples of SaaS may also include data storage providers, e.g. Citrix ShareFile from Citrix Systems, DROPBOX provided by Dropbox, Inc. of San Francisco, Calif., Microsoft SKYDRIVE provided by Microsoft Corporation, Google Drive provided by Google Inc., or Apple ICLOUD provided by Apple Inc. of Cupertino, Calif.

Similar to SaaS, DaaS (which is also known as hosted desktop services) is a form of virtual desktop infrastructure (VDI) in which virtual desktop sessions are typically delivered as a cloud service along with the apps used on the virtual desktop. Citrix Cloud from Citrix Systems is one example of a DaaS delivery platform. DaaS delivery platforms may be hosted on a public cloud computing infrastructure such as AZURE CLOUD from Microsoft Corporation of Redmond, Wash. (herein "Azure"), or AMAZON WEB SERVICES provided by Amazon.com, Inc., of Seattle, Wash. (herein "AWS"), for example. In the case of Citrix Cloud, Citrix Workspace app may be used as a single-entry point for bringing apps, files and desktops together (whether on-premises or in the cloud) to deliver a unified experience.

Figure 4:
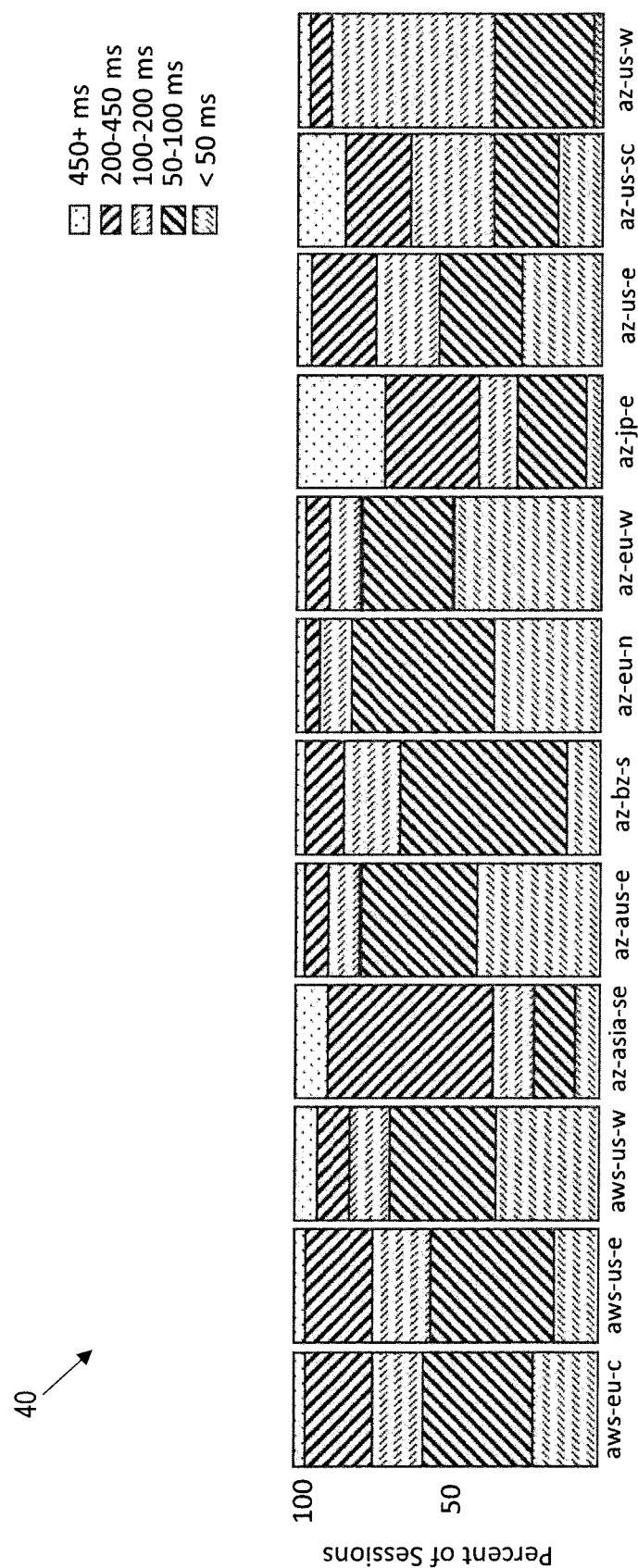
FIG. 4 is a diagram illustrating round trip times (RTT) for different cloud services Points of Presence (POPs) based upon geographic location.
Figure 5:
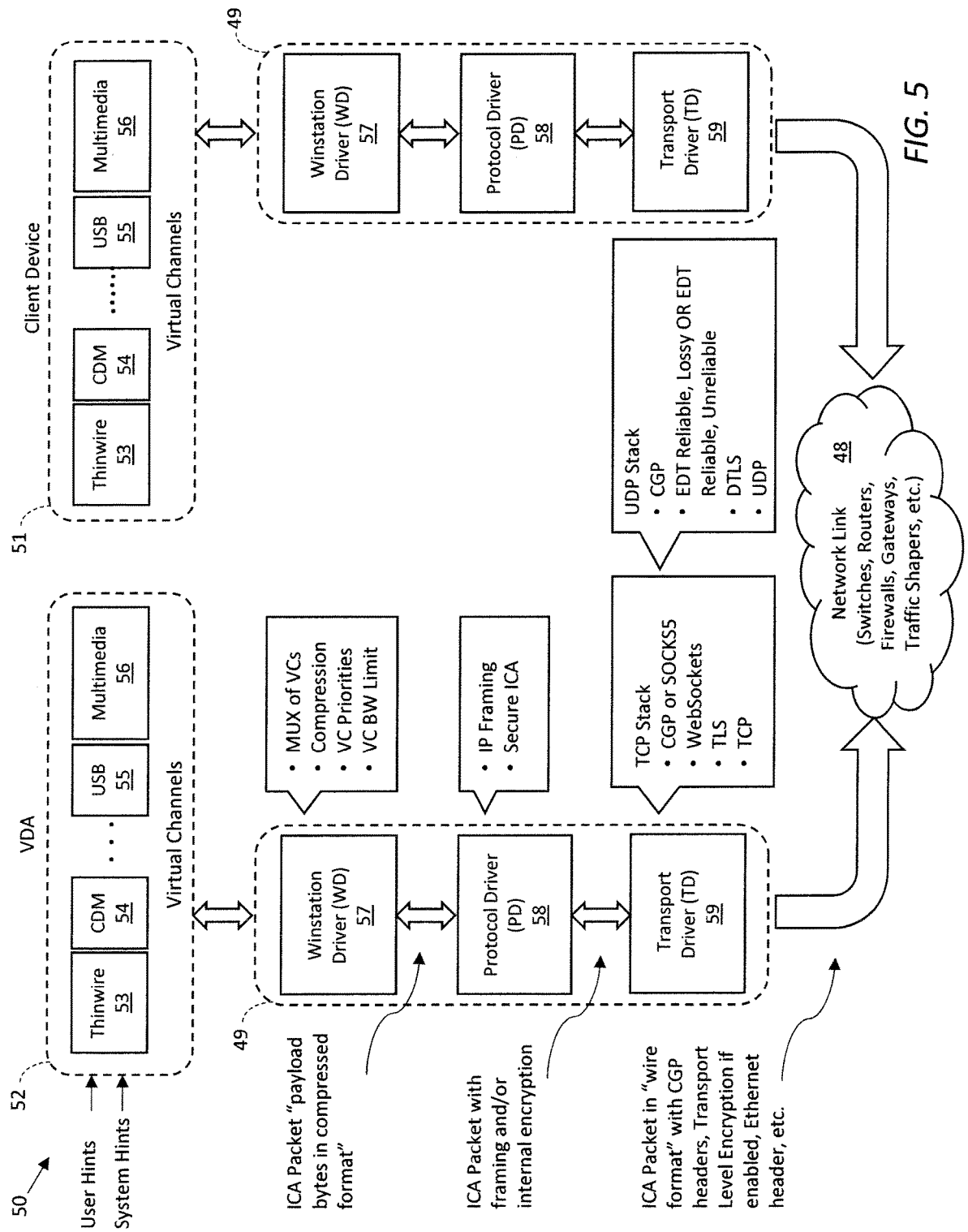
FIG. 5 is a schematic block diagram of an example computing system in which various embodiments may be implemented for providing virtual computing sessions with enhanced client computing device display remoting features.

Turning now to FIGS. 4-5, systems and methods are provided for hierarchical display within a remote computing context, including optimized region detection and delivery in challenging network conditions using a combination of user and system hints. By way of background, as more workloads are migrated into the Cloud and datacenters are consolidated across continents, the network conditions between the workloads and the client endpoints become more challenging and are characterized with much higher latency and packet loss. For example, Citrix Workspace is a service that provides consolidated remote access to cloud-based workloads of desktops and apps, e.g. Citrix Virtual Apps and Desktops (LVAD) among other services, or a hybrid combination of Cloud and on-premises workloads with consolidated Store experience. In addition, Citrix Gateway as a Service (GWaaS), allows users to remotely access both Cloud and on-premises workloads without setting up customer on-premises Citrix NetScaler Gateway. However, the network hops to and from the Cloud further increase network latencies.

The bar chart 40 of FIG. 4 shows the Independent Computing Architecture (ICA) file Round Trip Time (RTT) in the different Citrix Gateway Points of Presence (POPs) based on geographic location. More particularly, Citrix ICA is a proprietary protocol for an application server system. It is not bound to any single platform, and provides a specification for passing data between server and clients. Citrix ICA includes a server software component, a network protocol component, and a client software component. All measurements are based on Citrix High-definition User Experience (HDX) over Transmission Control Protocol (TCP) as transport protocol. Citrix HDX technology is a set of protocols and capabilities that work together to deliver a high-definition user experience of virtual desktops and applications to client computing devices over any network from a data center. ICA RTT measures the interactivity of the HDX session, e.g., the click-to-photon time. For example, this may be the time difference between a user input event (keyboard, mouse, touch, electronic pen) at a client device hosting Citrix Receiver or Citrix Workspace App (CWA) and the corresponding graphics update generated by the hosted application and delivered at the client device hosting CWA. ICA RTT is not necessarily equal to the network layer 7 latency, because ICA RTT can be influenced by the application response time, server load, etc.

As seen in the bar chart 40, user experience (UX) with the Asia-Pacific workloads (as-asia-se) is particularly challenging. But even in the US, over 50% of the connections incur ICA RTT of 100 ms or higher, e.g., az-us-w or az-us-sc. There are additional cases of users in remote branch office locations using Very Small Aperture Terminal (VSAT) connections with 1000-2000 ms latency. In the bar chart 40, "aws" refers to Amazon Web Services installations, while "az" refers Azure installations.

In addition, high-resolution (e.g. 4K) and multi-monitor displays make graphics loads even higher. Conversely, when using mobile devices, while resolutions are lower, there may be an expectation of native-like application responsiveness with products such as Citrix Receiver/Workspace App. User experience may be "laggy" in certain situations, such as: normal office workloads such as typing, mouse or touch window dragging, scrolling, app switching, etc.; 3D Pro use cases of interacting with complex 3D graphics models; and Virtual Reality (VR) use cases with virtual hosted apps, e.g. with apps and desktops provided by CVAD.

To improve both throughput and interactivity, example embodiments of the systems and methods set forth herein may utilize a shift to User Datagram Protocol (UDP) as a transport protocol to overcome some of the limitations of TCP. TCP uses the Additive Increments Multiplicative Decrements (AIMD) congestion control algorithm and cannot fully utilize bandwidth in conditions of latency and loss. In modern networks bandwidth tends to be more plentiful and packet loss is mostly due to endpoint interference (stochastic loss) and not congestion. Therefore, some packet loss can be tolerated without drastically reducing throughput. For example, entire Google product families are migrating to QUIC. Citrix HDX has recently introduced the Enlightened Data Transport (EDT) protocol, a reliable-transmission UDP-based protocol, which has better congestion and flow control than TCP in challenging network conditions, while still being fair in terms of bandwidth allocation.

For a typical transoceanic WAN of 250 ms RTT and 1% packet loss each way, HDX over EDT as transport performs much better than over TCP as follows: the virtual session interactivity is up to 2.5 times better (the extent depends on the workload, e.g., scrolling text in Notepad vs. web page with images); the speed of file transfer with client drive mapping (remote file copy)—up to 10× improvements; the speed of printing (printing from a hosted application to a client or network-mapped printer)—up to 2× improvements; and the speed of generic USB redirection—up to 35% improvements. The more stream-oriented and less interactive the remoting technology, the higher the benefits of reliable EDT. Therefore, the performance improvements with EDT vary with the different technologies being remoted and the respective remoting virtual channel protocols.

In each of the bars in the bar chart 40, the bottom section of the bar represents the percentage of ICA files that have an RTT time <50 ms; the next section up is the percentage of ICA files that have an RTT time of 50-100 ms; the next section up is the percentage of ICA files that have an RTT time of 100-200 ms; the next section up is the percentage of ICA files that have an RTT time of 200-450 ms; and the top section of each bar represents the percentage of ICA files that have an RTT time of >450 ms, as indicated by the associated key.

While EDT benefits all ICA Virtual Channels (VCs) to varying degrees, there is still room for improvement due to the fact that EDT is currently a reliable protocol (only)—meaning any lost packets results in packet retransmissions—which invariably limits interactivity of UX. For example, loss of user input packets could cause delay in transmission of subsequent user input packets until the lost packets are successfully retransmitted. As another example, loss of graphics update packets could cause delay in transmission of subsequent graphics update packets until the lost packets are successfully retransmitted. Improvements in HDX Thinwire such as progressive display for transient regions (fuzzy-first, sharpen up when changes stop) help improve UX, but they are still limited by the reliable nature of the underlying transport protocol. Thinwire is the Citrix default display remoting technology used in CVAD. Display remoting technology allows graphics generated on one machine to be transmitted, typically across a network, to another machine for display.

In addition, current graphics region analysis and classification is based on framebuffer analysis, which is CPU and memory intensive. While APIs such as the Microsoft Desktop Deduplication API provide facilities for "dirty region" detection (e.g. graphics regions that have recently changed and require and update to be transmitted), they are not available on all OSs and graphics driver models in use by CVAD, for example. In addition, even when available, these APIs do not provide additional granular information about the semantics of the graphics data, for example, a distinction between static images, fast changing graphics (video), text. Therefore, additional framebuffer analysis is always required for efficient operation.

Referring to FIG. 5, the system 50 illustrates a display remoting architecture by which client devices 51 may remotely access virtual computing sessions (e.g., virtual desktops and apps) from a host, such as a VDI or cloud-based virtualization infrastructure. In the illustrated example, the client devices 51 are connected to the virtual computing sessions by a virtual delivery appliance 52, such as provided by Citrix VDA, for example. The client device 51 and virtual delivery appliance 52 communicate via a plurality of different virtual channels, including a Thinwire (Graphics) channel 53, Client Drive Mapping (CDM) channel 54, Universal Serial Bus (USB) channel 55, multimedia channel 56, etc. Virtual channel data passes through a series of drivers within an Independent Computing Architecture (ICA) protocol stack 49 which performs different functions, by loading a set of required and optional protocol drivers to establish a successful and fully functional connection to a remote session, including a winstation driver (WD) 57 which performs virtual channel multiplexing, compression, prioritization, and bandwidth limiting, for example. Further, one or more instances of a protocol driver (PD) 58 may perform, for example, IP framing and secure ICA (custom encryption) operations, while a transport driver (TD) 59 performs TCP stack operations such as Citrix Common Gateway Protocol (CGP) or SOCKS5, WebSockets, TLS, and TCP, and/or UDP stack operations including CGP, Enlightened Data Transport (EDT) (with options for both reliable and unreliable (lossy) transport), Datagram Transport Layer Security (DTLS), and UDP.

In the illustrated example, between the winstation driver 57 and protocol driver 58, the ICA packets are payload bytes in compressed format, and between the protocol driver and transport driver 59 the ICA packets have framing and/or internal encryption. Between the transport driver 59 and a network link (which may include switches, routers, firewalls, gateways, traffic shapers, etc.), the ICA packets are in a wire format with CGP headers, transport level encryption (if enabled), ethernet headers, etc. The same operations illustrated on the virtual delivery appliance 52 side of the system 50 are also performed by the corresponding components on the client side. It should be noted that the system 50 is but one example configuration in which the example display remoting techniques set forth herein may be implemented, and that other suitable architectures may be used in different implementations.

Generally speaking, various advantageous display remoting optimization techniques may be performed within the example architecture of the system 50 (or other suitable architectures). These include optimization techniques for region detection, classification and update prioritization, and hierarchical display with optimized graphics remoting in challenging network conditions (with latency and/or packet loss). More particularly, the optimized graphics remoting may help to: achieve better interactivity at the expense of fidelity with lossy transmission or combination of reliable and lossy transmission in some areas; further improve interactivity in important areas with Forward Error Correction (FEC) of reliable transmissions (with some trade off with bandwidth and CPU utilization); regain fidelity in important areas with FEC of lossy transmissions (and thus achieving better quality along with interactivity at the expense of some bandwidth and CPU); and selecting optimal FEC algorithm based on expected bitrate, percentage loss and/or other factors. In addition, in some implementations user and system hints may be used to facilitate all of the above, and user input may be sent with aggressive FEC to avoid retransmission delays and with negligible impact on bandwidth. These various aspects will be described further below with respect to FIGS. 6-14.

The example embodiments set forth herein advantageously provide an opportunity to improve user experience through one or more aspects. A first aspect is by way of more efficient and granular graphics region detection, classification and update prioritization based on combination of virtual session input from user and system hints, and without having to perform frame buffer analysis. Another aspect pertains to sending less important or transient updates in an unreliable (lossy) way over a new EDT-lossy transport protocol, e.g., sending updates in a "fire-and-forget" manner. Still another aspect pertains to sending important updates reliably, or in a lossy way, but in both cases using FEC. Thus, for reliable traffic, retransmission need only be used when FEC fails. For lossy traffic, retransmission when FEC fails is optional depending on data semantics. For example, if lost, a graphics frame may not have to be retransmitted because subsequent frames may carry more up-to-date graphics, thus eliminating the need to retransmit the now obsolete graphics frame. As another similar example, a lost individual mouse-drag event might not have to be retransmitted because subsequent mouse-drag events may carry a current mouse position, etc. Yet another aspect utilizes FEC for both graphics updates and user input to avoid retransmission delays in either direction.

One challenge relates to selection of the FEC algorithm to minimize overall impact on bandwidth, or conversely the effective content bitrate, and CPU and to avoid latency in the FEC computations themselves. For example, FEC algorithms work best when applied to equal-sized packets and to constant bit-rate streams such as audio or video. However, when applied to interactive traffic such as HDX, the size of the data packets and the bit-rate are not guaranteed and can vary substantially depending on user activity, application type, session resolution, etc. In this regard, various factors may be considered in order to apply FEC techniques in a useful manner as further described below. These factors include congestion avoidance, i.e., FEC increases the bandwidth consumption and/or lowers the effective bitrate of data transmission, while decreasing effective loss. Yet, sending at a bitrate above the estimated available bandwidth may cause congestion. Another factor is cost. For example, while bandwidth is more plentiful in modern networks, data shows that in some Asia regions it is multiple-times more expensive than in the US.

Still another factor to consider is interactivity. If a next packet is missing from the send queue (for example, if the user has not generated additional input events (e.g. keyboard, mouse, touch, pen input) or the hosted application has not generated further graphics updates (e.g. no further updates currently required)), to complete a batch of FEC-encoded packets, a simple application of FEC might have to send dummy packets, which wastes bandwidth, or wait for a next packet, which introduces delay and defeats the purpose of using FEC. Therefore, predicting a bitrate and applying desired FEC encoding for interactive traffic may be significant for desired performance.

Figure 6:
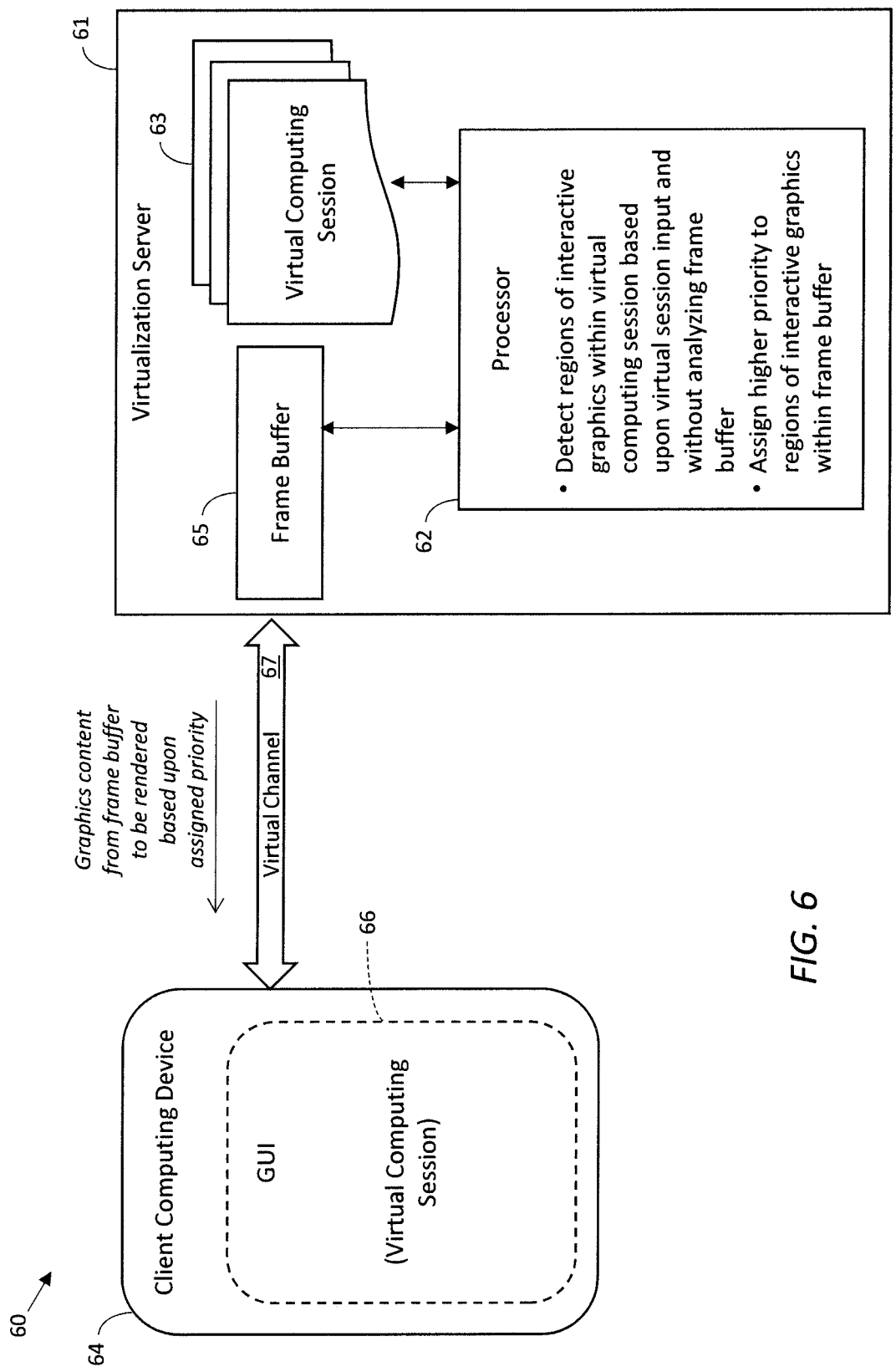
FIG. 6 is a schematic block diagram of a computing system which provides enhanced display remoting through interactive graphics prioritization in accordance with an example embodiment.
Figure 7:
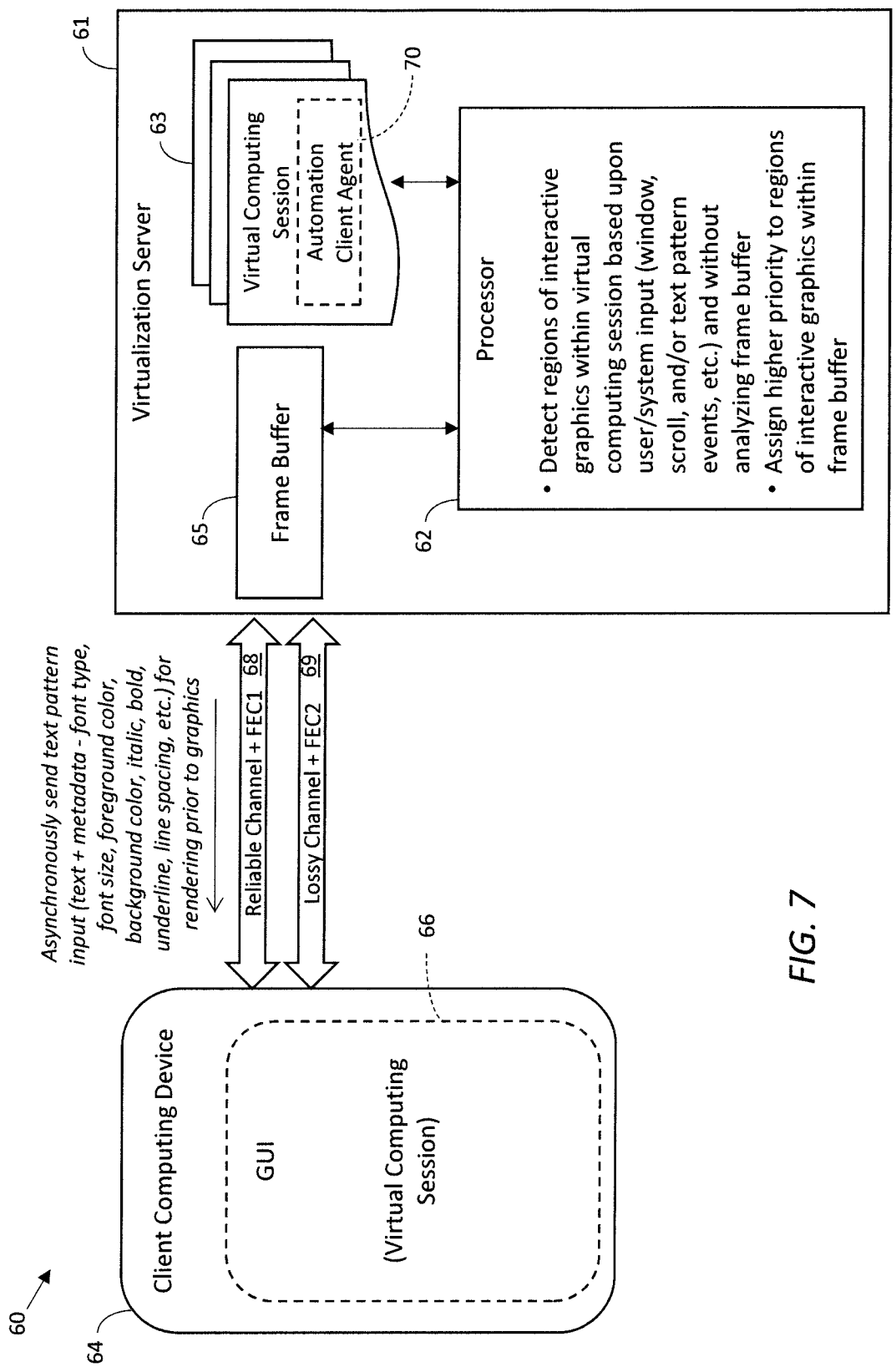
FIG. 7 is a schematic block diagram of the computing system of FIG. 6 illustrating further aspects that may be performed with interactive graphics prioritization in accordance with example embodiments.

Referring now to FIGS. 6-7, an example virtualization system 60 is shown in which a virtualization server 61 illustratively includes a processor 62 configured to host virtual computing sessions 63 to be displayed at one or more client computing devices 64 via a frame buffer 65. As noted above, the client computing device 64 may take various forms, such as a desktop/laptop computer, smartphone, tablet computer, etc., and is configured to render the virtual computing sessions via a graphical user interface (GUI) 66. The virtualization server 61 may further detect regions of interactive graphics within a virtual computing session 63 based upon a virtual session input, which may include user and/or system hints, without analyzing the frame buffer 65, and assign a higher priority to the regions of interactive graphics within the frame buffer. As such, the contents of the frame buffer 65 may be sent to the client computing device 64 over a virtual channel(s) 67 for rendering in the GUI based upon the assigned priority. That is, the regions or interactive graphics may be rendered/updated first as compared to other areas of the GUI (e.g., static backgrounds, etc.) to provide faster display updates with respect to the areas of interest to the user, thereby enhancing user experience. Moreover, since the frame buffer 65 does not have to be analyzed or scanned line by line to differentiate areas of higher importance (e.g., interactive graphics regions) within the frame, this too may contribute to faster processing speeds and/or reduced computational overhead.

In the example implementation of FIG. 7, a UI automation client agent is provided to capture the virtual session input, including hints taken from user input. In other embodiments, the hints taken from user input may not require the use of an automation client agent. For example, user input hints may be directly derived from a virtualization server 61 subsystem (not shown) responsible for injecting the user input provided by the client computing device 64 into the respective virtual computing session 63. Other types of virtual session input may be system hints gleaned from hooks into the virtual computing sessions 63. Generally speaking, the virtual session input may comprise one or more of a window pattern event, a scroll pattern event, and a text pattern event, for example.

For example, and by way of a background, UI elements may expose (or support) one or more patterns: window pattern (e.g. supported by application windows), text pattern (e.g. supported by edit controls, document or rich text viewing and processing controls), scroll pattern (e.g. supported by scrollable views), grid pattern (e.g. supported by table or spread-sheet processing views). In some instances, UI elements may be embedded or otherwise form a hierarchy of UI elements, e.g. a document editing view may contain a scroll container comprising a text pattern within a scroll pattern. The different UI element patterns may issue respectively named events. For example, a UI element supporting a window pattern may issue Window pattern events, e.g. move, maximize, minimize, close, etc. As another example, a UI element supporting a Text pattern may issue Text pattern events, e.g. text changed, text selection changed, etc. As yet another example, a UI element supporting a scroll pattern may issue scroll events, e.g. vertical-scroll-up or vertical-scroll-down event, etc.

As will be discussed further below, the processor 62 may be also configured to asynchronously send text pattern input data associated with a text pattern event to the client computing device 64 for rendering prior to rendering of corresponding contents of the frame buffer 65, to even further enhance user experience. That is, the client computing device 64 may pre-render or preview the changing text even before the corresponding graphics content from the frame buffer 65 is fully received. More particularly, the text pattern input data may include text data (e.g., ASCII or UTF-8 characters, symbols, etc.) and associated text metadata, such as font type, font size, foreground color, background color, italic, bold, underline, line spacing, etc. In still another example implementation, the text pattern input data may correspond to a text pattern within a scroll container (e.g., a text window with a scroll bar).

Furthermore, the processor 62 may also be configured to send the contents of the frame buffer 65 corresponding to the regions of interest with a different level of FEC than other content within the frame buffer, as will be discussed further below. In the illustrated example, the processor 62 is configured to send graphics data corresponding to the regions of interactive graphics from the frame buffer 65 to the client computing device 64 on a different channel than the other graphics content from the frame buffer. Here, the interactive graphics data is sent via a reliable channel 68, and the remaining graphics data from the frame buffer to the client computing device via a lossy channel 69. Moreover, different amounts or types of FEC may be applied to each of these channels, and the amount of FEC applied may also be varied or otherwise throttled in some instances, as will be discussed further below.

The foregoing will be further understood with reference to various implementation examples which may be provided within the framework shown in FIG. 5, for example. However, it will be understood that the techniques described herein may be implemented in other system architectures as well. System hints for region detection may include one or more approaches. A first approach is virtual app window tracking. For example, this may be provided by the Citrix CVAD Seamless App Support Virtual Channel (VC) subsystem, which enumerates and tracks updates to top-level windows. Another approach is virtual app process monitoring, e.g., as provided by process monitoring driver used by the Seamless App Support VC subsystem. Still another approach may include detecting patterns, properties and events retrieved from hosted applications or desktop environment, e.g., based on Microsoft UI Automation API (successor of Microsoft Active Accessibility API). In particular, the client API enables applications to interact with controls in other applications and retrieve information about them. An agent in the HDX session may use the client API to retrieve information about hosted applications and the desktop. The agent may register for specific event notifications, and can request that specific UI Automation properties and control pattern information be passed into its event handlers. A further approach may include network loss percentage, loss standard deviation, latency, and available bandwidth, which may be measured by the HDX transport driver, for example. It should be noted that loss computations may exclude the impact of FEC itself.

User hints may include active user input from a keyboard, mouse, touch or other input devices. Another example is user input at specific UI elements of a hosted application or desktop. For example, this may include a click or tap in a UI element supporting ScrollPattern, or keyboard input in a UI element supporting TextPattern, etc.

The above noted hints are used as inputs and may be utilized to optimize interactive graphics delivery by Thinwire, for example, as described further below. As noted above, Thinwire is the Citrix XenApp Virtual Channel (VC) for graphics remoting between host and client. However, it will be appreciated that other graphics remoting tools and systems may also be used in different embodiments.

With respect to optimization techniques for region detection, classification and update prioritization, providing location hints to the host Thinwire bitmap match-points algorithm may result in faster and more efficient (less CPU, memory) cached bitmap detection. Furthermore, providing location hints to the host Thinwire text detection algorithm may advantageously result in faster and more efficient (less CPU, memory) cached glyphs detection.

A system hint for region detection may be provided by window movement, e.g., from a UI automation client agent running in the virtual session and listening to WindowPattern events and property updates. This may be used as a trigger to the Thinwire graphics consumer module in the virtual session. Example parameters may include old and new window position, size.

The following is an example process flow which may be used for window movement detection and graphics remoting optimization:
  Local screen-to-screen copy/BitBlit (approximate) command sent server to client.
  Local fill of exposed area at client:
    With solid color;
    Or with pre-cached graphics of exposed window or desktop background. This may require tracking of window hierarchy and proactively sending window-surface graphics of overlapped windows to be cached at client.
  <asynchronously>
  Send exposed area server to client.
  <asynchronously>
  Provide location hint (region movement) to host Thinwire bitmap match-points algorithm.
    Send new window area as now seen by Thinwire:
      Cached bitmap or new bitmap depending on match hit or miss respectively.
Note that this approach may also cover the case where window contents might have changed while dragging.

With respect to window/container scrolling, this may be similar to the window movement approach described above, but for localized scrolled area as opposed to whole window movement. A system hint of scrolling, for example, may be provided from a UI automation client agent running in the virtual session and listening to ScrollPattern and/or ScrollItemPattern events and property updates. This may be used as a trigger to the Thinwire graphics consumer module in the virtual session. Parameters may include old and new values for whether the UI control is horizontally and/or vertically scrollable, horizontal and vertical view sizes, horizontal and vertical scroll percentages. The following is an example process flow:
  Local screen-to-screen copy/BitBlit (approximate) command sent server to client.
  Local fill of exposed area at client with solid color.
  <asynchronously>
  Send exposed area server to client.
  <asynchronously>
  Provide location hint (region movement) to host Thinwire bitmap match-points algorithm.
  Send remaining visible region (viewport) of scroll container as now seen by Thinwire:
    Cached bitmap or new bitmap depending on match hit or miss respectively.
Here again, this may cover the case where scrolled item contents might have changed while scrolling.

With respect to window/container scrolling with text, an optimized version of the window/container scrolling described above may be used. More particularly, the following additional system hints may be used: detecting TextPattern within the exposed area of the visible region (viewport) of the scroll container; and detecting TextPattern within the remaining visible region (viewport) of the scroll container. The following is an example process flow:
  Local screen-to-screen copy/BitBlit (approximate) command sent server to client.
  If TextPattern was detected within exposed area:
    Send actual text with attributes server to client: font type, font size, foreground/background color, italic, bold, underlined, line spacing, etc.
  Local rendering of received text at client (approximate)
  <asynchronously>
  Provide location hint (region) to host Thinwire text detection algorithm.
  Otherwise:
  Local fill of exposed area at client with solid color.
  <asynchronously>
  Provide location hint to host Thinwire bitmap match-points algorithm.
  Send exposed area server to client.
  If TextPattern actually existed within exposed area:
    Set of cached and/or new glyphs depending on match hits or misses respectively
  Otherwise:
    Cached bitmap or new bitmap depending on match hit or miss respectively.
  <asynchronously>
  If TextPattern was detected within remaining visible region:
    Provide location hint (region) to host Thinwire text detection algorithm.
  Otherwise:
    Provide location hint (region movement) to host Thinwire bitmap match-points algorithm.
    Send remaining visible region as now seen by Thinwire:
    If TextPattern actually existed within remaining visible region:
      Set of cached and/or new glyphs depending on match hits or misses respectively.
    Otherwise:
      Cached bitmap or new bitmap depending on match hit or miss respectively.
      May cover the case where scrolled item contents might have changed while scrolling, although less likely.

The client first provides an approximate update to the user based on the actual text with attributes (text metadata) received from the server (asynchronously, in practice sooner). The client then provides a true final application update using text glyphs (graphics) (asynchronously, in practice layer). This approach advantageously improves interactivity by first providing the light-weight approximate feedback, followed by the heavier feedback in terms of computing power and bandwidth, yet with accurate final application feedback. The text metadata may be sent over the lossy transport 69 and/or with FEC to achieve a further interactivity benefit.

With respect to text editing, a system hint of input focus in UI element containing TextPattern (e.g., from the UI automation client agent 70 running in the virtual session and monitoring for input focus into controls containing text) may be used as a trigger to the Thinwire graphics consumer module in the virtual session. Parameters may include location of input focus, text within certain range of characters, words, lines, paragraphs, pages or whole document, font type, font size, foreground/background color, italic, bold, underlined, line spacing, etc. The following is an example process flow:

Determine cursor (input focus) position.
Detect input focus in UI element containing TextPattern.
Detect either one or more of:
    Active user input (from input channels)
    Changing text (TextChangedEvent)
    Text selection change (TextSelectionChangedEvent)
    Etc.
Provide location hint (region) to host Thinwire text detection algorithm.
Determine important area around input focus:
    Based on threshold of surrounding word or character count (before/after), font type and size, line spacing, indentation, bullet style, text selection range, etc.
    Request QoS in VC Write interface:
        Higher priority.
        Send with high degree of FEC.
    Send either reliably with FEC or in a lossy manner with FEC. A decision may be based on where the updated text is relative to the cursor position:
        If left/above: not expected to change soon, so use reliable transmission.
        If right/below: expected to change soon, so use lossy transmission until changes stop, then use reliable transmission.

If the size of text area changed is above a certain threshold, the technique described above for window/container scrolling with text may be used to speed up response time as follows:

Send actual text with attributes server to client: font type, font size, foreground/background color, italic, bold, underlined, line spacing, etc.
Local rendering of received text at client (approximate). <asynchronously>
Send important area around input focus.

As with the window/container scrolling with text described above, the client computing device 64 may first provide approximate updates to the user through the GUI 66 based on the actual text with attributes (text metadata) received from the virtualization server 61 (asynchronously, in practice sooner). The client computing device 64 may then provide a true final application update using text glyphs (graphics) (asynchronously, in practice later). This approach advantageously improves interactivity by first providing the light-weight approximate feedback, followed by the heavier (in terms of computing power and bandwidth) but accurate final application feedback. Here again, the text metadata may be sent over the lossy transport 69 and/or with FEC to get further interactivity benefit.

Figure 8:
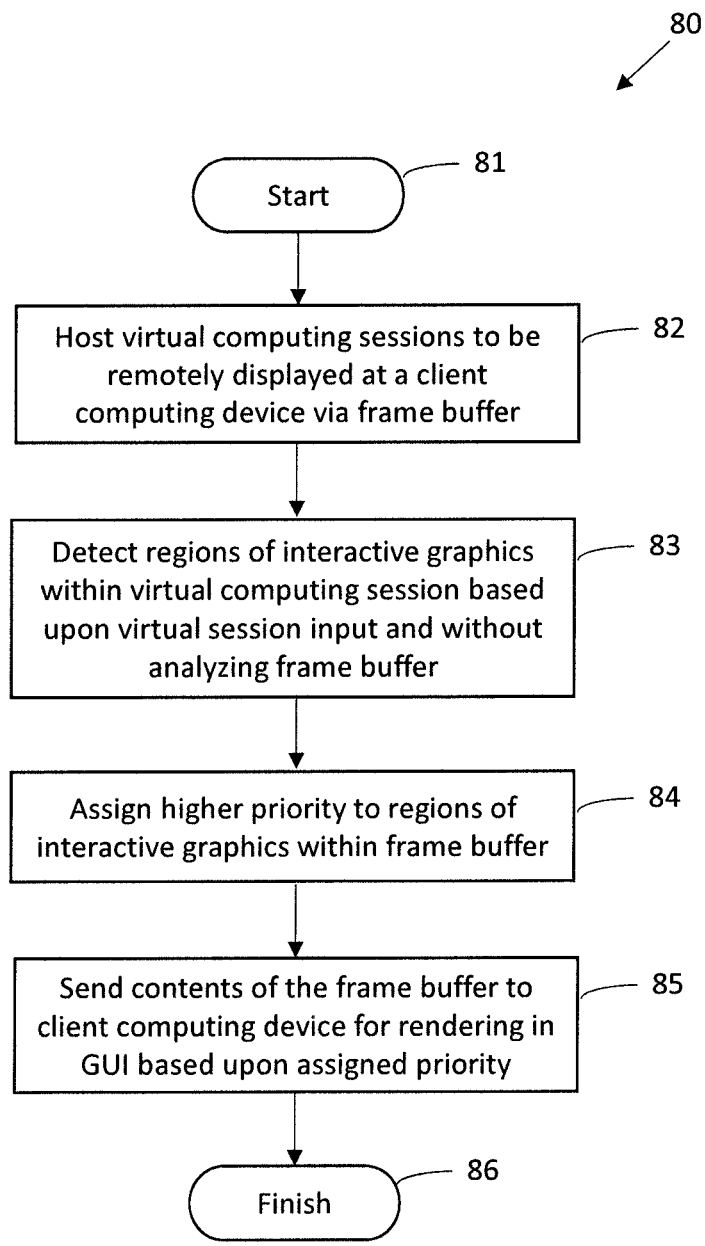
FIG. 8 is a flow diagram illustrating method aspects associated with the system of FIG. 6.

Referring now to the flow diagram 80 of FIG. 8, related method aspects with respect to the system 60 are now described. Beginning at Block 81, the method may include hosting virtual computing sessions 63 at the virtualization server 61 to be remotely displayed at the client computing device 64 via the frame buffer 65, at Block 82. As noted above, the client computing device 64 renders the virtual computing sessions 63 locally via the GUI 66. The method further illustratively includes detecting regions of interactive graphics within a virtual computing session 63 at the virtualization server 61 based upon a virtual session input (e.g., the user and/or system hints described further above) and without analyzing the frame buffer 65, at Block 83, and assigning a higher priority to the regions of interactive graphics within the frame buffer at the virtualization server (Block 84). The method also illustratively includes sending the contents of the frame buffer 65 from the virtualization server 61 to the client computing device 64 for rendering in the GUI 66 based upon the assigned priority (Block 85), as discussed further above. The method of FIG. 8 illustratively concludes at Block 86.

Figure 9:
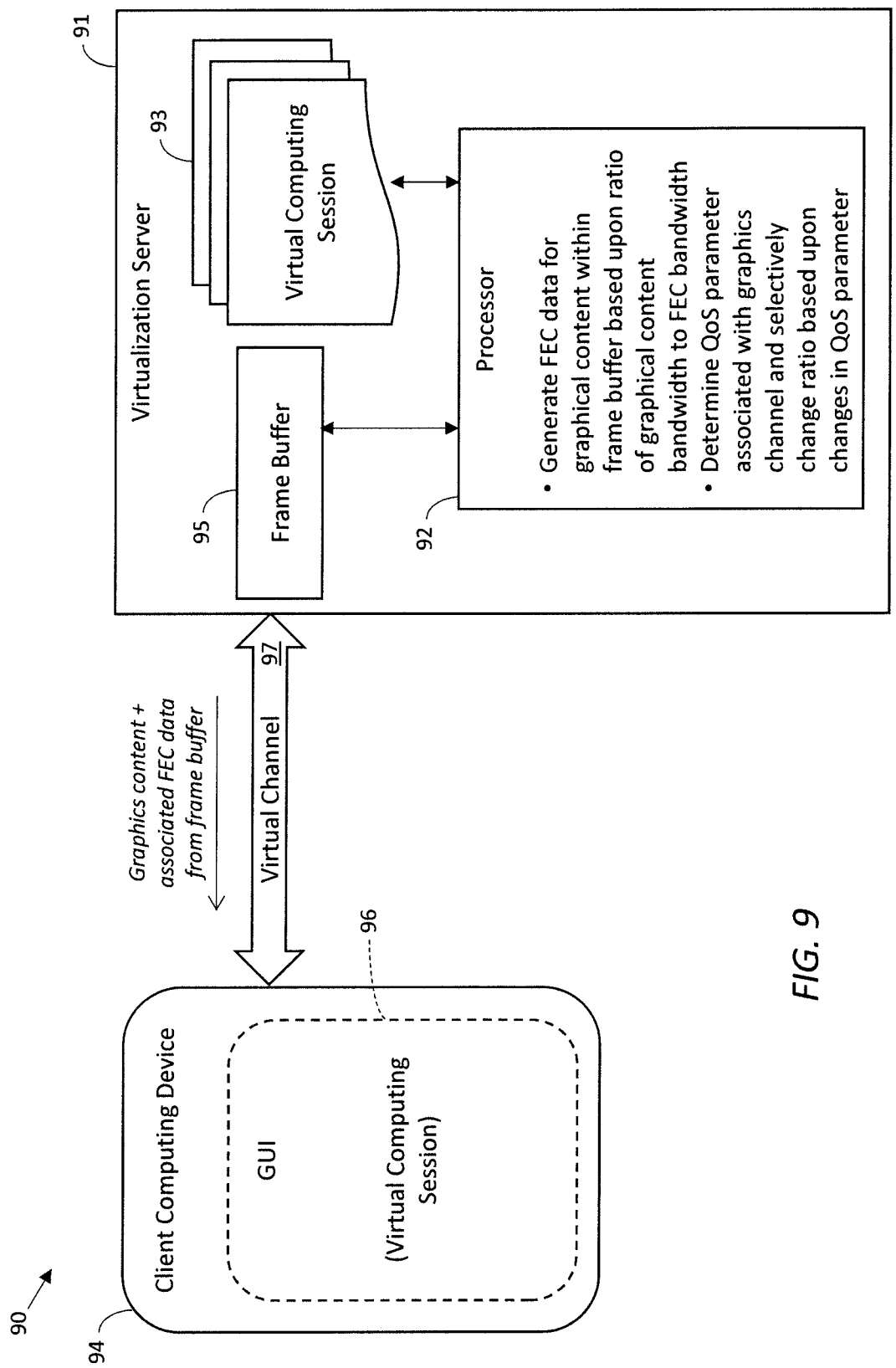
FIG. 9 is a schematic block diagram of a computing system which provides enhanced display remoting through forward error correction (FEC) in accordance with an example embodiment.
Figure 10:
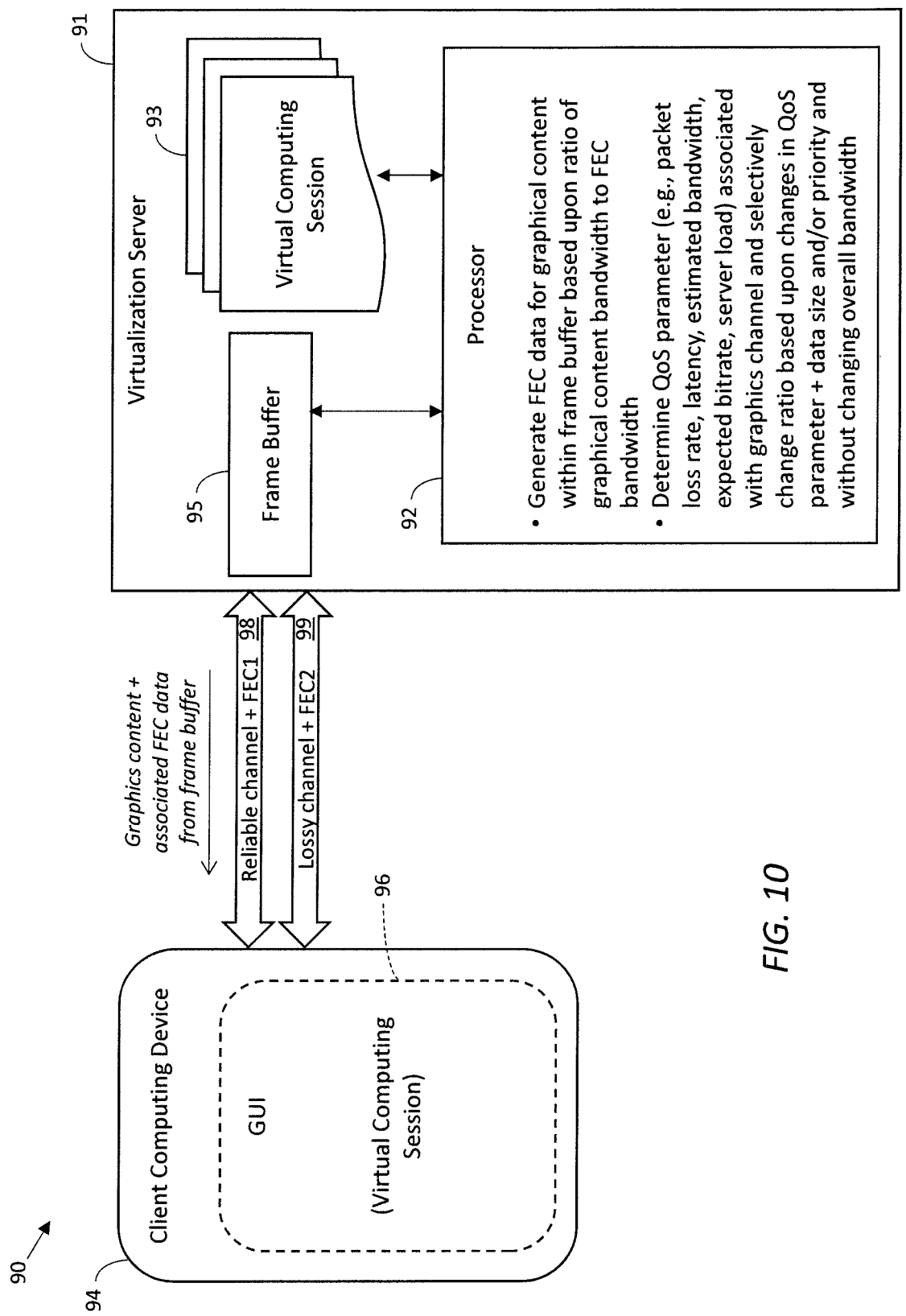
FIG. 10 is a schematic block diagram of the computing system of FIG. 9 illustrating further aspects that may be performed with FEC in accordance with example embodiments.

Turning to FIGS. 9-10, another example embodiment is now described which relates to choosing an appropriate degree and/or type of FEC based upon QoS levels or parameters, and in some instances across different virtual graphics channels (e.g., reliable and lossy channels). In the illustrated example, a computing system 90 illustratively includes a virtualization server 91 with a processor 92 configured to host virtual computing sessions 93 to be remotely displayed via a frame buffer 95, and a client computing device 94 configured to remotely access the virtual computing sessions from the virtualization server and render the virtual computing session via a GUI 96, as discussed above. However, the processor 92 may be further configured to generate FEC data for graphical content within the frame buffer 95 based upon a ratio of graphical content bandwidth to FEC bandwidth.

Moreover, the processor 92 further sends the graphical content and associated FEC data to the client computing device 94 over one or more virtual channels 97 for display within the GUI 96. Additionally, the processor 92 is also configured to advantageously determine a QoS parameter associated with the virtual channel(s) 97, and selectively change the ratio of graphical content bandwidth to FEC bandwidth based upon changes in the QoS parameter, as will be discussed further below.

More particularly, the graphical data content sent to the client computing device 94 may be divided into packets, and in one example implementation the QoS parameter may be a packet loss rate. In this case, the ratio of graphical content bandwidth to FEC bandwidth may decrease as the packet loss rate increases, and vice-versa. That is, more FEC data may be generated and sent to the client computing device 94 (consuming more of the overall available bandwidth) to help alleviate increased packet loss. It should be noted that in some cases the processor 92 may selectively change the ratio of graphical content bandwidth to FEC bandwidth without changing an overall bandwidth of the virtual channel(s) 97, although the processor 92 may also increase/or decrease the overall available bandwidth while also adjusting the ratio of graphics to FEC data that is being sent. Further details and examples of how the ratio may be changed are discussed further below In the example embodiment illustrated in FIG. 10, both a reliable channel 98 and a lossy channel 89 are used for sending different graphics content, such as with the approach described above. In this case, different ratios may be used for the graphics data being sent across the different channels 98, 99. For example, the ratio of graphical content bandwidth to FEC bandwidth on the reliable channel 98 may higher than a ratio of graphical content bandwidth to FEC bandwidth on the lossy channel 99, as there should be less packet loss across the reliable channel. Further, these ratios may be adjusted or changed based upon respective QoS measurements associated with each channel, and in some cases different types of QoS measurements may be used for the different channels as well.

The manner in which the QoS measurements are made may different with the different types of measurements. For example, as noted above and discussed in further detail below, loss, latency, estimated bandwidth, etc. may be measured by the HDX stack in the above-described Citrix architecture. Other measurements, such as expected bit-rate, may be specific to remoted technology. For example, they may be a factor of user input and respective expected graphics subsystem generating graphics. A goal may be to use FEC sparingly but sufficiently to ensure "important" data gets delivered without delay and even "less important" data gets delivered with acceptable loss in quality.

In another example implementation, the QoS parameter may relate to latency, and the ratio of graphical content bandwidth to FEC bandwidth may decrease as latency increases. That is, more FEC data is sent relative to the graphics data as latency increases, and vice-versa. In still another example, the QoS parameter may relate to an estimated bandwidth for the graphics channels 97, and the ratio of graphical content bandwidth to FEC bandwidth may increase or decrease as the estimated bandwidth increases to allow for more graphics data or FEC data to be sent, as desired. Additionally, in another example implementation, the QoS parameter may comprise an expected bitrate associated with the virtual channels 97, and the ratio of graphical content bandwidth to FEC bandwidth may decrease as the expected bitrate decreases, for example, and vice-versa. Still another QoS parameter may relate to a server load (e.g., how many processes are waiting in the queue to access the computer processor) associated with the virtualization server 91.

It should be noted that other QoS parameters than the examples provided above may be used in different embodiments, and also that the processor 92 may take into account more than one QoS parameter in determining when to make changes to the ratio of graphics content to FEC bandwidth. Furthermore, in some implementations a delay or hysteresis may be used when changing the ratio to account for brief changes or spikes in a particular QoS measurement, and the changes may be made as the measured QoS reaches different thresholds, if desired.

The foregoing will be further understood with reference to various implementation examples. Here again, these example implementations are provided in the context of the framework illustrated in FIG. 5, but these techniques may be applied within other virtualization architectures as well. Generally speaking, it may be desirable to apply FEC when there is packet loss. Otherwise bandwidth may be wasted with no benefit. The packet loss calculation may be independent, i.e., not skewed by, FEC. By way of example, FEC may be desirable in network conditions where: there is inherent random packet loss, e.g., on WAN or on wireless network; available bandwidth is high, although it could still be limited and shared; and maximum acceptable latency is limited, and also comparable to or lower than the network RTT.

The virtualization server 91 may decide how to split total throughput between content bandwidth and FEC bandwidth. For example, the server may decide to use a 90% to 10% ratio with moderate loss rate, or 66% to 33% ratio with higher loss rate. Other gradients could also be used.

The virtualization server 91 may also simply add FEC to the outgoing stream, which will increase overall bandwidth usage. Alternatively, the server may keep overall bandwidth usage the same and adjust or otherwise throttle down the content data rate, while using the remainder for FEC. The latter approach is more conducive to network fair-sharing and congestion avoidance where the server estimates available bandwidth and ensures it does not exceed it.

The virtualization server 91 may package content to be transmitted into groups (or frames) of ideally same-size packets, where the group size in bytes could be the content bandwidth times maximum acceptable latency due to FEC computations. For example, for each group of N content packets, the FEC algorithm may create K FEC packets. Any reasonable values for N and K may be used. The resulting bandwidth split is N/(N+K) for content, K/(N+K) for FEC. Moreover, up to K packets may be lost in a group transmission, either content or FEC, and the receiving side will still be able to restore the original N content packets.

At the server transport driver 59, the ICA packet provides a good natural boundary, e.g., ~5 KB in high throughput mode. It may be split into 4 packets, for example. In such case, FEC may be applied such that: 1 extra FEC packet—tolerate 1 dropped packet (20% loss); and 2 extra FEC packets—tolerate 2 dropped packets (33% loss). In practice, results may be less as loss is sometimes consecutive.

A simple form of FEC is "exclusive OR" (XOR), which does not require additional libraries. There are multiple different forms of FEC and libraries which may be used in example embodiments, which normally have two parts: mathematical computations, and applying the FEC. For example, Jerasure, Erasure Coding Library, is an open source library for the necessary math primitives. Another example approach is GF-Complete. Other suitable approaches may also be used.

A server graphics consumer module that generates graphics updates to be transmitted may attempt to generate data packets consistent with the maximum application payload size, i.e., the network Maximum Transfer Unit (MTU) minus any protocol overhead, e.g., from transport encryption, reliability, framing, ICA protocol overhead, etc. The graphics module may generate updates periodically. For example, a frame update will very naturally map to a group of N content packets protected by a group of K FEC packets. For desired results, to minimize latency, the frame size may be equal to, or a multiple of, the maximum application payload size. Similarly, for video encoding, e.g. H.264, the Network Abstraction Layer Units (NALUs) may be consistent with the maximum application payload size.

Latency in the FEC encoding/decoding process in the transport drivers 59 would come from having to buffer a complete group of packets at the sender/server before generating FEC, and from restoring lost packets at the receiver/client side. With the optimization above, latency would only be incurred by having to collect the whole frame update at the client before starting to render it.

Example embodiments may utilize one or more FEC optimization techniques. A first optimization technique involves graphics transmission over a reliable transport or channel 98 with FEC, and/or over a lossy transport of 99 with FEC. In this case, the graphics module may detect EDT as transport, which may provide EDT-reliable and EDT-lossy capabilities. The graphics module may further detect exceeding QoS thresholds of loss rate, latency, available bandwidth, etc. (assuming lowering effective content bitrate is not desired), and it may further switch to a hybrid reliable-lossy mode.

Regarding lossy transport with FEC, some graphics updates are sent unreliably, e.g., using an additional Lossy VC Write interface that does not guarantee reliable or in-order delivery. Further, FEC requests may be handled by the transport driver 59 based upon the QoS parameter to the Lossy VC Write interface. The Lossy VC Write interface returns a ticket that can be queried about the state of the packet being transmitted, e.g., delivered, lost, unknown, etc. The graphics module may optionally hold on to the transmitted data in case it may decide to retransmit it.

In the event that the FEC fails, a response is sent over EDT transport response channel, e.g., a Nack/Ack for the packet. The state of the ticket associated with the packet is updated, and the graphics module holding the ticket receives the update. Furthermore, the graphics module retransmits the lost data with the same QoS request, requests more aggressive FEC, sends it over the reliable transport instead, or decides to give up on the lost data and sends more recent data instead.

With respect to reliable transport with FEC, other graphics updates are still sent reliably, but this time using a Reliable VC Write interface with a QoS parameter instructing the transport driver 59 to use FEC. In the event the FEC fails, EDT transport handles the retransmission automatically just like any other packet sent reliably without FEC. The graphics module is not concerned with querying the state of the packet, i.e., no ticket needs to be provided.

It should be noted that loss rate and latency thresholds triggering the use of FEC may be different for reliable vs. lossy transmissions. For example, thresholds could be higher for reliable transmissions. Furthermore, the QoS parameter may also imply different FEC algorithms to use for different configurations, e.g., assuming tradeoffs with CPU and memory. Moreover, the degree of requested FEC for both reliable and lossy transmissions depends on a number of inputs, as will be discussed in further detail below.

Another optimization technique relates to the inputs for determining the degree or aggressiveness of FEC to be applied. With respect to loss, a higher FEC may be used for higher average percentage loss and higher standard deviation of loss. With respect to latency, a higher FEC may be used for higher latency in combination with loss. With respect to bandwidth, a higher FEC may be used for higher estimated bandwidth.

Furthermore, the importance of the graphics data may also be taken into account. More particularly, higher FEC may be used for more important data. For example, more important data might relate to key frames of video, adding large bitmap to client cache, drawing bitmap from client cache, adding glyphs (for text) in client cache, drawing glyphs from client cache, solid fills, screen-to-screen copy, text being actively edited in proximity, etc. On the other hand, less important graphics data may relate to intermediary frames of video, transient bitmaps, text that is being actively scrolled, etc. Similarly, the size of the graphics data may also be taken into account, e.g., higher FEC for smaller data. With respect to small packets, it may be most efficient to simply duplicate them. As noted above, other examples include bitrate (e.g., higher FEC may be used with smaller expected bitrate), server load (e.g., a higher FEC may be used with more spare capacity), etc.

Still another FEC optimization approach relates to the frequency, type, and/or location of user input. The following are examples: typing fast, font is large; mouse or touch dragging an area of a scrollbar, or a window title bar; clicking or tapping window control area (minimize, maximize, close); alt-tab or other combination to switch apps, etc. These may indicate a higher immediate bitrate from the graphics response.

Another factor is the application in focus. For example, a web browser or a media player may indicate a higher bitrate than a word processing app or a simple text editor. Other factors may include top-level window size, display resolution, and the graphics subsystem consumer module configuration (e.g., Frames per Second (FPS)).

In some embodiments, an application of machine learning (ML) may be implemented using the above-mentioned input to train an ML model. This may be done in real time by offloading to a separate appliance. Once an ML model has been run on multiple workloads, then simplified static ranges may be created and used for more efficient and real-time prediction of bitrate.

With regard to bitrate, if the expected bitrate increases, the degree of FEC may be decreased, and optionally turned off above a threshold level. This increases the effective content bitrate, but with an associated risk of effective loss. However, this may be desirable because subsequent updates may supersede any lost graphics updates. In addition, bandwidth savings may be desired to avoid reaching estimated bandwidth and causing congestion.

On the other hand, if expected bitrate decreases, then the degree of FEC may be increased. If insufficient packets are available in the send queue to complete a group/batch of FEC-encoded packets, the transport driver 59 may send dummy packets to avoid delay, or duplicate packets. This decreases effective content bitrate but also decreases risk of loss. Moreover, this is desired where subsequent updates are not expected soon. In addition, sufficient bandwidth may be expected.

Below an expected bitrate threshold level, the graphics consumer module may send a high-quality update. For example, if user input stops and no more changes are expected, a "final/sharp" image may be sent. Current "build to lossless" systems send the high-quality update when detected changes stop, which invariably happens with some delay and detracts from interactivity. Using hints such as user input allows the system 90 to detect the need to send a high-quality update sooner and improves interactivity. The high-quality update may be sent reliably with FEC, for example.

Figure 11:
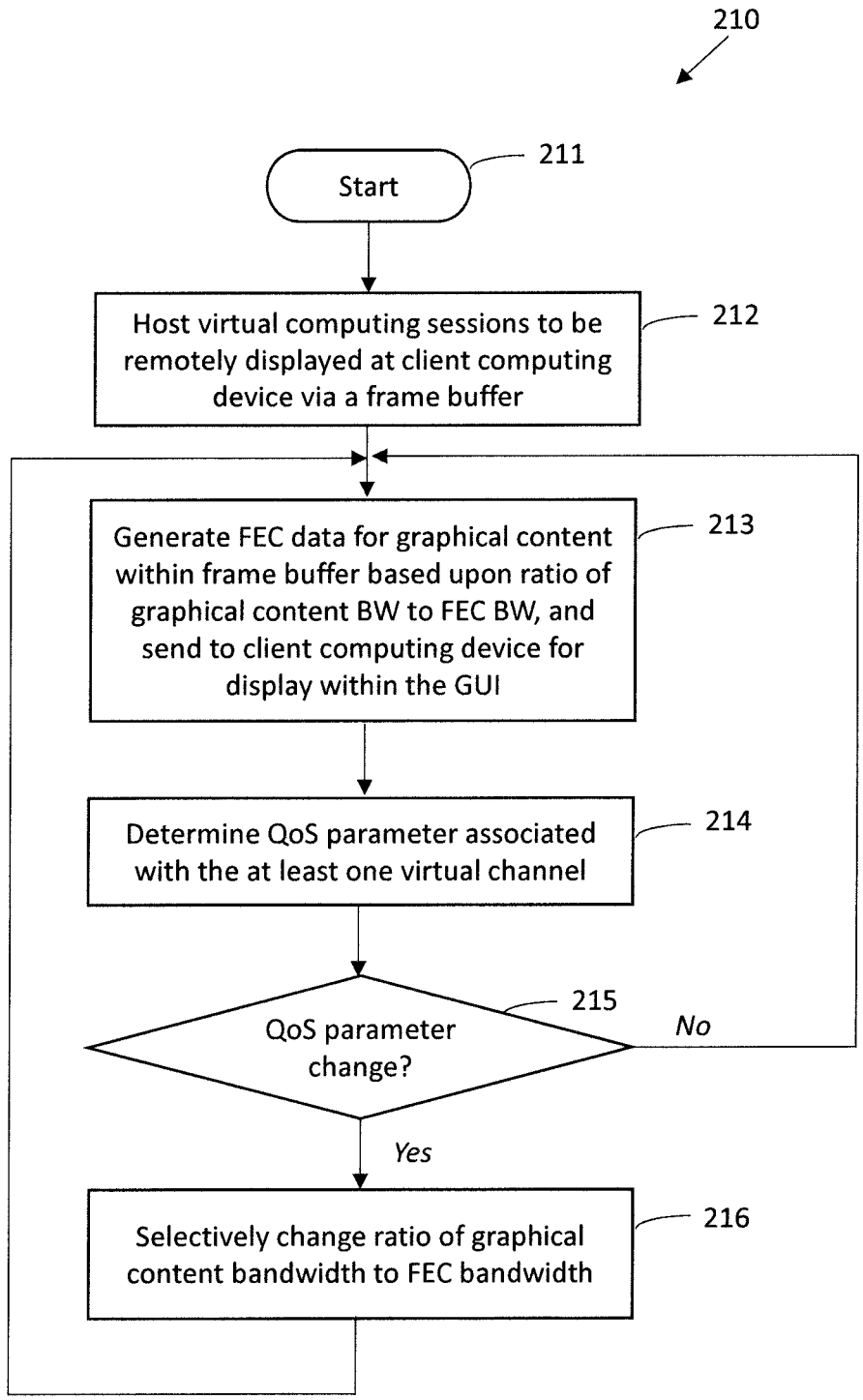
FIG. 11 is a flow diagram illustrating method aspects associated with the system of FIG. 9.

Referring additionally to the flow diagram 210 of FIG. 11, related method aspects with respect to the system 90 are now described. Beginning at Block 211, the method illustratively includes hosting virtual computing sessions 93 at the virtualization server 91 to be remotely displayed at the client computing device 94 via the frame buffer 95, at Block 212. The method further illustratively includes generating FEC data for graphical content within the frame buffer 95 at the virtualization server 91 based upon a ratio of graphical content bandwidth to FEC bandwidth, and sending the graphical content and associated FEC data from the virtualization server to the client computing device 94 over virtual channel(s) 97 for display within the GUI 96, at Block 213. The method also illustratively includes determining a QoS parameter associated with the virtual channel(s) 97, at Block 214, and selectively changing the ratio of graphical content bandwidth to FEC bandwidth at the virtualization server 91 based upon changes in the QoS parameter, at Blocks 215, 216, as discussed further above.

Figure 12:
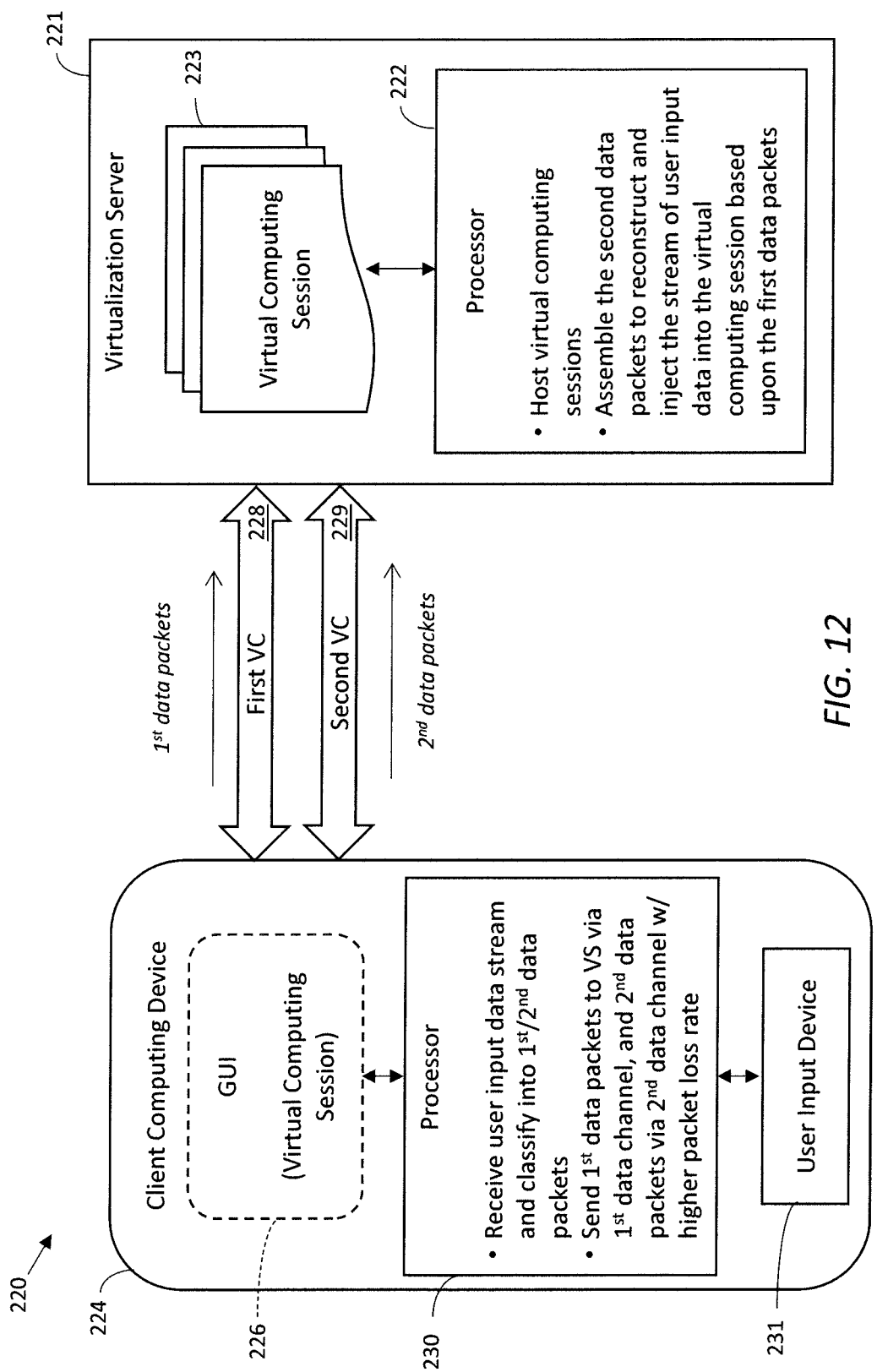
FIG. 12 is a schematic block diagram of a computing system which provides enhanced display remoting through user input prioritization and transmission in accordance with an example embodiment.
Figure 13:
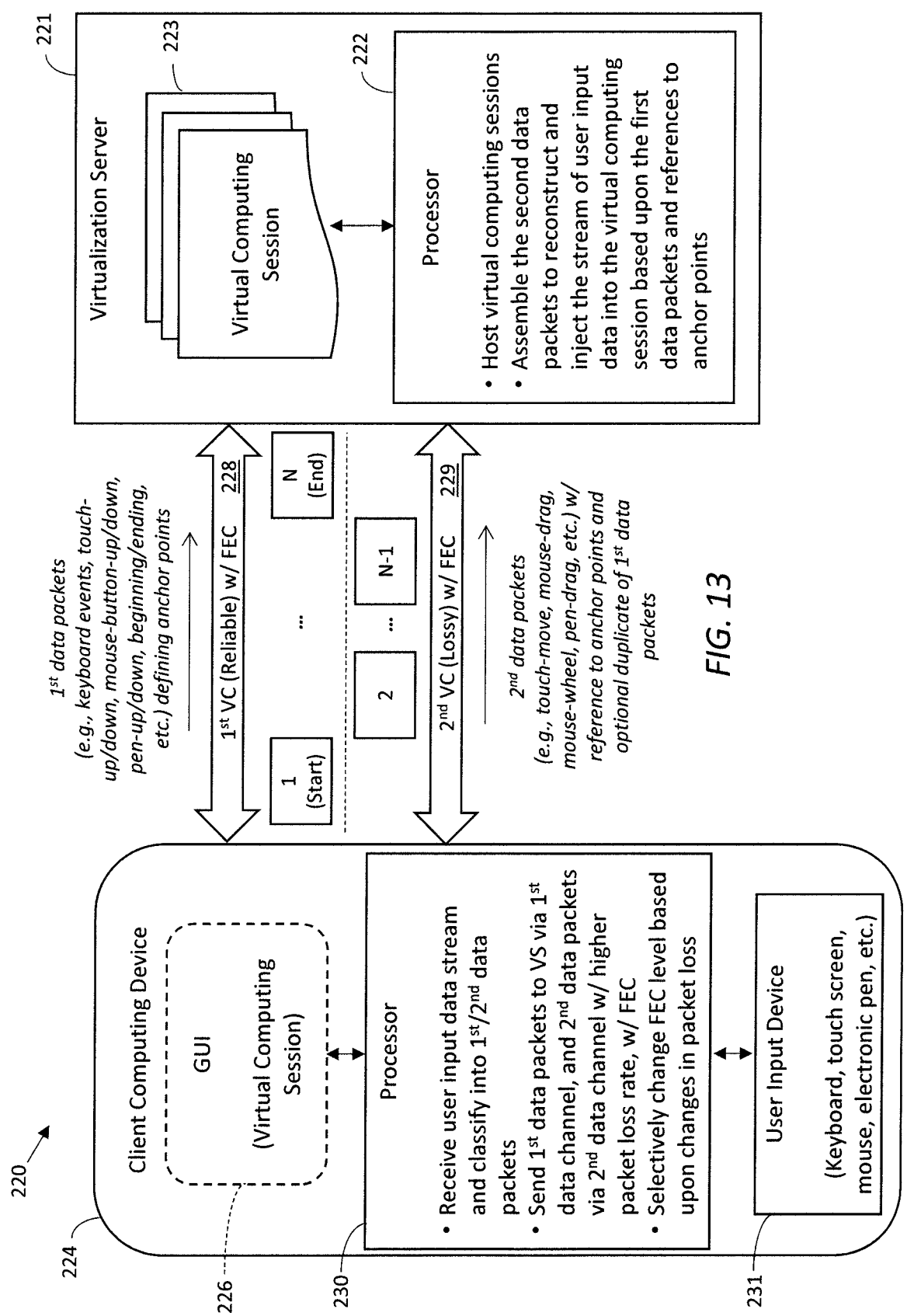
FIG. 13 is a schematic block diagram of the computing system of FIG. 12 illustrating further aspects that may be performed with user input prioritization and transmission in accordance with example embodiments.

Turning to FIGS. 12-13, another example embodiment is now described which relates to prioritize and divide user input data and send it across different virtual channels to provide enhanced graphics rendering capabilities. A computing system 220 illustratively includes a virtualization server 221 configured to host virtual computing sessions 223, and a client computing device 224 configured to render the virtual computing sessions within a GUI 226, as discussed above. The client computing device 224 illustratively includes a processor 230 configured to receive a stream of user input data associated with the virtual computing session from one or more user input devices 231, and classify the stream into first and second data packets.

More particularly, the first data packets have a higher priority than the second data packets. The processor 230 is also configured to send the first (i.e., high priority or critical) data packets to the virtualization server 221 via a first (e.g., reliable) virtual channel 228, and send the second (lower) data packets to the virtualization server via a second virtual channel 229 having a higher packet loss rate associated therewith than the first virtual channel (e.g., a lossy channel). The virtualization server 221 illustratively includes a processor 222 that is configured to assemble the second data packets to reconstruct and inject the stream of user input data into the virtual computing session 223 based upon the first data packets.

In the example illustrated in FIG. 13, a string of data packets 1 through N are included in the stream of user input, and the first data packets (here packets 1 and N) are the beginning and ending packets of the stream of user input data, respectively. The second data packets are those in between the first and last packets, namely the packets 2 through N−1. In this way, the first data packets advantageously define points of reference or anchor points within the stream of user input data, and the client computing device 224 may send the second data packets to the virtualization server 221 via the second virtual channel 229 along with references to the anchor points (e.g., that the start packet is packet 1 and the end packet is packet N). As such, the processor 222 may advantageously assemble the second data packets (i.e., packets 2 through N−1) to reconstruct and inject the stream of user input data into the virtual computing session 223 based upon the references to the anchor points (i.e., start and end data packets 1 and N, respectively). It should be noted that other approaches for selecting high priority packets and referencing these packets may be used in different embodiments.

In some example embodiments, the processor 230 may be further configured to also send one or more of the first data packets via the second virtual channel 229 as well as the first data channel 228 to provide redundancy and help ensure faster reconstruction of the user input data stream should communications over the first channel 228 be delayed, if desired. Also, as discussed further above, the processor 230 may also advantageously apply FEC to the first and second data packets prior to sending, and also selectively change a level of FEC applied to one or both of the first and second data packets based upon spikes in data packet loss, etc., if desired.

The user input events creating the stream of upper input may come from various different types of user input devices 231. For example, where the user input device 231 is a keyboard, the first data packets may correspond to keyboard events input via the keyboard. Where the user input device 231 is a touch screen, the first data packets may correspond to touch-up and touch-down events (e.g., when a finger touches or is removed from the display) input via the touch screen, while the second data packets may correspond to touch-move events (e.g., when a finger touching the display is moved along the display) input via the touch screen, for example. In another example embodiment where the user input device 231 is a mouse, the first data packets may correspond to mouse-button-up and mouse-button down events (e.g., which the mouse button is depressed or released) input via the mouse, while the second data packets may correspond to mouse-drag (e.g., the mouse button is held and/or the pointer moved) or mouse-wheel events (e.g., the mouse wheel is scrolled up or down) input via the mouse. In still another example embodiment where the user input device 231 is an electronic pen or stylus, the first data packets may correspond to pen-up and pen down events (e.g., when the electronic pen touches or is removed from the display) input via the electronic pen, while the second data packets may correspond to pend-drag events (e.g., when the electronic pen is touching the display and the point is moved along the display) input via the electronic pen. However, it should be noted that other input devices and designations of the first (high priority) and second (lower priority) data packets may be used in different embodiments.

The foregoing will be further understood with reference to various implementation examples. Here again, these example implementations are provided in the context of the framework illustrated in FIG. 5, but these techniques may be applied within other virtualization architectures as well. Above certain thresholds of loss and latency, one approach which may be used is to send important input events, e.g. keyboard events, touch-down, touch-up, mouse-button-down, mouse-button-up, etc. reliably. Moreover, less important input events are sent in a lossy way, e.g. touch-move, mouse-drag, mouse-wheel, pen-drag. In addition, FEC or simple packet duplication may optionally be applied to one or both reliable and lossy user input transmissions, since impact to the bandwidth will be negligible but the redundancy will guarantee smooth user experience in conditions of loss and latency. This is consistent with low expected bitrate, small data size and important data factors discussed above.

As noted above, user input may be prioritized and classified into critical and non-critical input (packets) and sent over reliable and non-reliable (lossy) streams 228, 229 respectively. Since the reliable and lossy streams are independent and asynchronous, reliable versus lossy input packets may be received out of order at the host, which may break the semantics of user input. Therefore, for each non-critical lossy packet the client computing device 224 may identify a prerequisite critical reliable packet by sequence number. This is specified at the client computing device 224 at time of packet formation. A critical packet may identify an "opening" of input sequence, e.g., mouse down before dragging begins.

Lossy packets may be cached at the host and not replayed (injected into the hosted app/desktop) until the respective critical prerequisite packet is also received. When a sequence "closing" critical packet is received, e.g., a mouse-button-up, any non-critical lossy packet that may be received subsequently and referring to a now "closed" prerequisite is discarded. For example, this may occur with a mouse drag that may be discarded if it is received after the sequence-closing mouse-button-up is received.

Critical input opportunistically may be sent over both reliable and lossy streams in some implementations. This further reduces potential synchronization lag on the host side when an input sequence involving reliable and lossy packets starts. For example, a mouse down event may be sent over both reliable and lossy transports. As explained above, mouse drags are held at the host before the corresponding sequence-starting mouse down is received first. Advantageously, if the mouse down is delivered as a prerequisite along with the mouse drags, the host can immediately start playing/injecting the input sequence. This may be useful if, for example, reliable and lossy streams are routed differently, different QoS is applied on them while in transit, and/or packets tend to arrive out of order for other reasons.

Additional FEC may be performed with some delay as well to handle spikes in loss. The delay with which this additional FEC (or packet duplication) is applied may be computed based on at least one of an average or standard deviation of loss spikes duration. In modern networks spikes of loss may occur, e.g., due to stochastic interference, where loss is consecutive rather than spread out and consistent with an average loss percentage. For example, in a network with 5% average packet loss, there may be spikes of loss where loss is at 50% for a duration of 2 seconds. So even though the initial FEC may be substantial and sufficient to cover 5% packet loss, it may be insufficient to cover the 20% loss during the spike. Therefore, applying an additional FEC (or duplication) after 2 seconds will improve the chances of the packet being delivered, although in some cases with delay. This may be better than applying the additional FEC consecutively, because a consecutive application may coincide with a spike.

Adjusting or throttling of the FEC may be performed using approaches similar to those discussed above. For example, the client computing device 224 may monitor typing of words or sentences and detect incomplete phrases or grammar to determine (anticipate) with a high level of confidence additional immediate user input. In other words, the client computing device 224 may predict incomplete words or sentence, and tune the extent of FEC accordingly (e.g., greater FEC for more dropped words/sentences).

Where size of the input is typically small, FEC has only a negligible impact on bandwidth and CPU but, in combination with reliable and lossy transmission, has significant impact on interactivity. Test results and demo videos were performed at 300 ms RTT with 5% packet loss. Approximately 3× improvement in interactivity was achieved with window movement, scrolling, painting, and other types of interactions, relative to the same interactions over an EDT reliable transport alone.

FEC may be applied to interactive traffic only in some embodiments, e.g., real-time audio or multimedia VCs, similar to Thinwire graphics discussed above. Bulk data transfer VCs, e.g., Client Drive Mapping (CDM VC, typically need not use the benefits of QoS requesting FEC, thus minimizing impact to bandwidth, although FEC may similarly be used in some embodiments if desired, for example, to increase the speed of remote file transfer at the expense of additional bandwidth usage.

Figure 14:
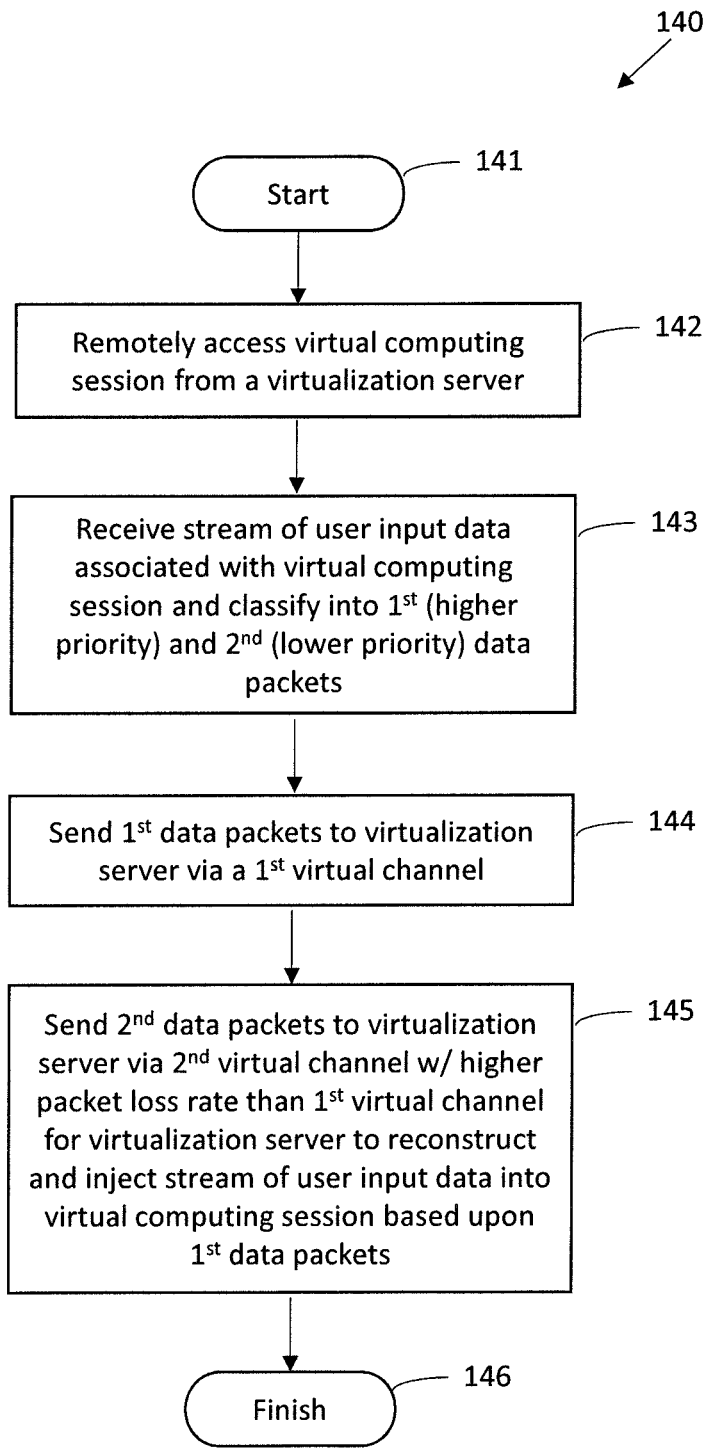
FIG. 14 is a flow diagram illustrating method aspects associated with the system of FIG. 12.

Turning to the flow diagram 140 of FIG. 14, method aspects related to the system 220 are now described. Beginning at Block 141, the method illustratively includes remotely accessing a virtual computing session 223 at the client computing device 224 from the virtualization server 221, at Block 142, and receiving a stream of user input data at the client computing device 224 associated with the virtual computing session and classifying the stream into first and second data packets, at Block 143. As noted above, the first data packets have a higher priority than the second data packets. The method also illustratively includes sending the first data packets from the client computing device 224 to the virtualization server 221 via the first virtual channel 228, at Block 144, and sending the second data packets from the client computing device to the virtualization server via the second virtual channel 229 which has a higher packet loss rate associated therewith than the first virtual channel, at Block 145. As a result, the virtualization server 221 may advantageously assemble the second data packets to reconstruct and inject the stream of user input data into the virtual computing session 223 based upon the first data packets, as discussed further above. The method of FIG. 14 illustratively concludes at Block 146.

Many modifications and other embodiments will come to the mind of one skilled in the art having the benefit of the teachings presented in the foregoing descriptions and the associated drawings. Therefore, it is understood that the foregoing is not to be limited to the example embodiments, and that modifications and other embodiments are intended to be included within the scope of the appended claims.

That which is claimed is:

1. A computing device comprising:
   a memory and a processor cooperating with the memory to
      host virtual computing sessions to be remotely displayed at a client device via a frame buffer, the client device configured to render the virtual computing sessions via a graphical user interface (GUI),
      generate forward error correction (FEC) data for graphical content within the frame buffer based upon a ratio of graphical content bandwidth to FEC bandwidth,
      determine a Quality of Service (QoS) parameter associated with at least one virtual channel,
      adjust the ratio of graphical content bandwidth to FEC bandwidth based upon changes in the QoS parameter, and
      send the graphical content and the adjusted FEC data to the client device over the at least one virtual channel for display within the GUI.

2. The computing device of claim 1 wherein the graphical content sent to the client device is divided into packets, and the QoS parameter comprises a packet loss rate; and wherein the ratio of graphical content bandwidth to FEC bandwidth decreases as the packet loss rate increases.

3. The computing device of claim 1 wherein the processor adjusts the ratio of graphical content bandwidth to FEC bandwidth without changing an overall bandwidth of the at least one virtual channel.

4. The computing device of claim 1 wherein the at least one virtual channel comprises a reliable channel and a lossy channel; and wherein a ratio of graphical content bandwidth to FEC bandwidth on the reliable channel is higher than a ratio of graphical content bandwidth to FEC bandwidth on the lossy channel.

5. The computing device of claim 1 wherein the QoS parameter comprises network latency; and wherein the ratio of graphical content bandwidth to FEC bandwidth decreases as network latency increases.

6. The computing device of claim 1 wherein the QoS parameter comprises an estimated bandwidth for the at least one virtual channel.

7. The computing device of claim 1 wherein the QoS parameter comprises an expected bitrate associated with the at least one virtual channel; and wherein the ratio of graphical content bandwidth to FEC bandwidth decreases as the expected bitrate decreases.

8. The computing device of claim 1 wherein the QoS parameter comprises a load associated with the server.

9. The computing device of claim 1 wherein the processor is further configured to selectively change the ratio of graphical content bandwidth to FEC bandwidth based upon a priority of the graphical content data within the frame buffer.

10. The computing device of claim 1 wherein the processor is further configured to selectively change the ratio of graphical content bandwidth to FEC bandwidth based upon a size of the graphical content data within the frame buffer.

11. A method comprising:
for virtual computing sessions hosted at a server to be remotely displayed at a client device via a frame buffer, with the client device being configured to render the virtual computing sessions via a graphical user interface (GUI), generating forward error correction (FEC) data for graphical content within the frame buffer at the server based upon a ratio of graphical content bandwidth to FEC bandwidth;
determining a Quality of Service (QoS) parameter associated with at least one virtual channel;
adjusting the ratio of graphical content bandwidth to FEC bandwidth at the server based upon changes in the QoS parameter; and
sending the graphical content and associated FEC data from the server to the client device over the at least one virtual channel for rendering within the GUI.

12. The method of claim 11 wherein the graphical content sent to the client device is divided into packets, and the QoS parameter comprises a packet loss rate; and wherein the ratio of graphical content bandwidth to FEC bandwidth decreases as the packet loss rate increases.

13. The method of claim 11 wherein selectively changing comprises adjusting the ratio of graphical content bandwidth to FEC bandwidth without changing an overall bandwidth of the at least one virtual channel.

14. The method of claim 11 wherein the at least one virtual channel comprises a reliable channel and a lossy channel; and wherein a ratio of graphical content bandwidth to FEC bandwidth on the reliable channel is higher than a ratio of graphical content bandwidth to FEC bandwidth on the lossy channel.

15. The method of claim 11 wherein the QoS parameter comprises network latency; and wherein the ratio of graphical content bandwidth to FEC bandwidth decreases as network latency increases.

16. A computing system comprising:
a server configured to host virtual computing sessions to be remotely displayed via a frame buffer; and
a client device configured to remotely access the virtual computing sessions from the server and render the virtual computing session via a graphical user interface (GUI);
wherein the server is further configured to
generate forward error correction (FEC) data for graphical content within the frame buffer based upon a ratio of graphical content bandwidth to FEC bandwidth,
determine a Quality of Service (QoS) parameter associated with at least one virtual channel,
adjust the ratio of graphical content bandwidth to FEC bandwidth based upon changes in the QoS parameter, and
send the graphical content and the adjusted FEC data to the client device over the at least one virtual channel for display within the GUI.

17. The computing system of claim 16 wherein the graphical content sent to the client device is divided into packets, and the QoS parameter comprises a packet loss rate; and wherein the ratio of graphical content bandwidth to FEC bandwidth decreases as the packet loss rate increases.

18. The computing system of claim 16 wherein the server adjusts the ratio of graphical content bandwidth to FEC bandwidth without changing an overall bandwidth of the at least one virtual channel.

19. The computing system of claim 16 wherein the at least one virtual channel comprises a reliable channel and a lossy channel; and wherein a ratio of graphical content bandwidth to FEC bandwidth on the reliable channel is higher than a ratio of graphical content bandwidth to FEC bandwidth on the lossy channel.

20. The computing system of claim 16 wherein the QoS parameter comprises network latency; and wherein the ratio of graphical content bandwidth to FEC bandwidth decreases as network latency increases.

* * * * *